United States Patent
Edahiro et al.

(10) Patent No.: US 7,764,542 B2
(45) Date of Patent: Jul. 27, 2010

(54) METHOD FOR PROGRAMMING A SEMICONDUCTOR MEMORY DEVICE

(75) Inventors: Toshiaki Edahiro, Yokohama (JP); Takuya Futatsuyama, Yokohama (JP); Toshiyuki Enda, Zushi (JP)

(73) Assignee: Kabushiki Kaisha Toshiba, Tokyo (JP)

( * ) Notice: Subject to any disclaimer, the term of this patent is extended or adjusted under 35 U.S.C. 154(b) by 295 days.

(21) Appl. No.: 12/061,105

(22) Filed: Apr. 2, 2008

(65) Prior Publication Data
US 2008/0253181 A1    Oct. 16, 2008

(30) Foreign Application Priority Data
Apr. 3, 2007   (JP) .............................. 2007-097507

(51) Int. Cl.
*G11C 16/04* (2006.01)
(52) U.S. Cl. .............................. 365/185.03; 365/185.28; 365/185.18; 365/185.17
(58) Field of Classification Search ............. 365/185.28, 365/185.03, 185.18, 185.17
See application file for complete search history.

(56) References Cited
U.S. PATENT DOCUMENTS 7,120,052 B2    10/2006 Shibata et al.
7,139,192 B1 *  11/2006 Wong ..................... 365/185.03
7,257,032 B2    8/2007  Fujiu et al.
7,633,802 B2 *  12/2009 Mokhlesi ............... 365/185.18
2006/0291291 A1* 12/2006 Hosono et al. ......... 365/185.22
2007/0153577 A1 7/2007  Guterman

FOREIGN PATENT DOCUMENTS

| JP | 10-112196   | 4/1998  |
| JP | 2001-84779  | 3/2001  |
| JP | 2002-8380   | 1/2002  |
| JP | 2002-299474 | 10/2002 |
| JP | 2004-94987  | 3/2004  |
| JP | 2007-4861   | 1/2007  |

OTHER PUBLICATIONS

U.S. Appl. No. 12/478,181, filed Jun. 4, 2009, Edahiro et al.
U.S. Appl. No. 12/491,638, filed Jun. 25, 2009, Futatsuyama et al.

* cited by examiner

*Primary Examiner*—Huan Hoang
*Assistant Examiner*—Fernando N Hidalgo
(74) *Attorney, Agent, or Firm*—Oblon, Spivak, McClelland, Maier & Neustadt, L.L.P.

(57) ABSTRACT

A method for programming a semiconductor memory device including such a program sequence as to program target threshold levels constituting multi-level data into multiple memory cells, which are simultaneously selected, wherein the program sequence is controlled to finish programming the multiple memory cells in order of height of the target threshold levels.

16 Claims, 21 Drawing Sheets

Lower Page PRG

Upper Page PRG

METHOD FOR PROGRAMMING A SEMICONDUCTOR MEMORY DEVICE

CROSS-REFERENCE TO RELATED APPLICATION

This application is based on and claims the benefit of priority from the prior Japanese Patent Application No. 2007-097507, filed on Apr. 3, 2007, the entire contents of which are incorporated herein by reference.

BACKGROUND OF THE INVENTION

1. Field of the Invention

This invention relates to an electrically rewritable and non-volatile semiconductor memory device, specifically relates to a method for programming it, which is able to obtain precise data threshold level distributions.

2. Description of the Related Art

There is increased a demand for NAND-type flash memories in accordance with increasing of the demand for mobile devices, which deal with large capacitive data such as a still or moving image. In the recent flash memories, since it is used such a multi-level data storage scheme that two or more bits are stored in one memory cell, it has become possible to store a quantity of information data in a relatively small chip area.

In a highly integrated flash memory, in which the cell miniaturization has been advanced, interference between adjacent cells affects data threshold distributions. Specifically, in a multi-level data storage scheme, threshold widths and gaps in the data threshold distributions are set to be narrower than those in a binary data storage scheme, so that the interference between adjacent cells affects the data reliability.

Considering the above-described situation, a programming technique, which suppresses the data threshold level variation due to capacitive coupling between floating gates of adjacent cells, has been disclosed in, for example, JP-A2004-192789.

On the other hand, to program data with narrow threshold distributions, it is usually in need of making the program voltage step as small as possible. As a result, it takes a long time to program a certain data level. With respect to this situation, there has been disclosed, for example, in JP-A2007-4861, such a high speed programming technique as to judge a memory cell's program speed and apply a program voltage pulse in accordance with the judged program speed.

SUMMARY OF THE INVENTION

According to an aspect of the present invention, there is provided a method for programming a semiconductor memory device including such a program sequence as to program target threshold levels constituting multi-level data into multiple memory cells, which are simultaneously selected, wherein the program sequence is controlled to finish programming the multiple memory cells in order of height of the target threshold levels.

According to an aspect of the present invention, there is provided a method for programming a semiconductor memory device including such a program sequence as to program target threshold levels constituting multi-level data into multiple memory cells, which are simultaneously selected, wherein the program sequence includes:

distinguishing between slow cells and fast cells with respect to memory cells to be programmed to a certain target threshold, the former being lower in program speed than the latter;

applying a program voltage pulse to the multiple memory cells, in which the program voltage is changed in level in correspondence with not only different target threshold levels to be programmed but also the slow cells and fast cells to be programmed to the certain target threshold level; and verify-reading the memory cells after applying the program voltage pulse.

DETAILED DESCRIPTION OF THE EMBODIMENTS

Illustrative embodiments of this invention will be explained with reference to the accompanying drawings below.

Embodiment 1

Figure 1:
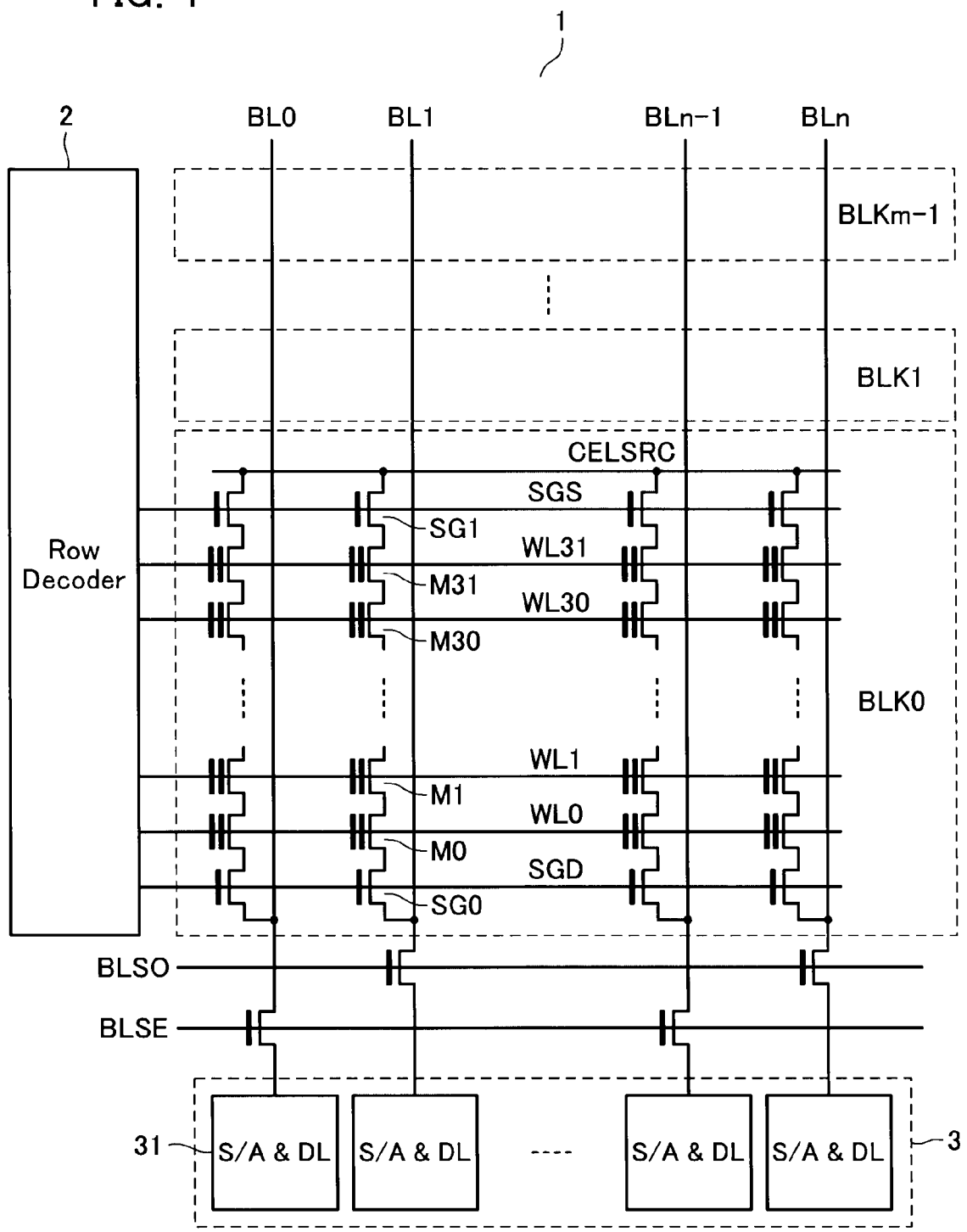
FIG. 1 shows a memory core configuration in a flash memory in accordance with an embodiment of the present invention.

FIG. 1 shows a memory core in a NAND-type flash memory with a multi-level data storage scheme in accordance with an embodiment. Memory cell array 1 is formed of multiple NAND cell units (i.e., NAND strings), each having a plurality of electrically rewritable and non-volatile memory cells M0-M31.

One end of each NAND cell unit is coupled to a bit line BL via a select gate transistor SG0; and the other end to a cell source line CELSRC via another select gate transistor SG1. Control gates of the memory cells M0-M31 in the NAND cell unit are coupled to different word lines WL0-WL31, respectively. Gates of the select gate transistors SG0 and SG1 are coupled to select gate lines SGD and SGS, respectively, which run in parallel with the word lines.

To select and drive the word lines WL(WL0-WL31) and select gate lines SGD, SGS, there is disposed is a row decoder 2. Each bit line BL is coupled to a sense amplifier (serving as a data latch) 31 in a sense amplifier circuit 3.

This case shows that a bit line is coupled to a sense amplifier 31 in a one-to-one correspondence. In this case, memory cells selected by a word line constitute a page, in which the entire memory cells are read or programmed (or written) simultaneously. This is a preferable scheme for reducing a parasitic gate effect in a programming method in accordance with this embodiment described later.

However, it may also be used in principle such a sense amplifier scheme that adjacent even and odd bit lines share a sense amplifier (serving a data latch). In this case, a half of the memory cells simultaneously selected by a word line constitutes a page, in which the memory cells are read or programmed simultaneously.

A set of NAND cell units sharing word lines constitutes a block, which serves as an erase unit. As shown in FIG. 1, a plurality of blocks BLK0, BLK1, ..., BLKm-1 are arranged in the bit line direction.

Figure 2:
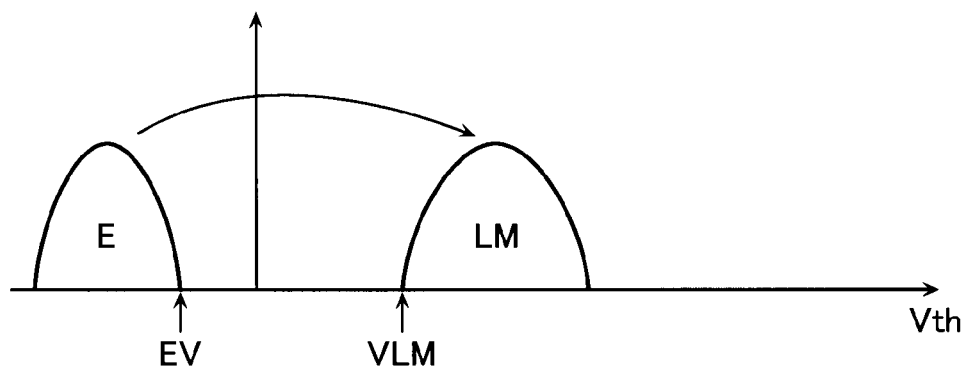
FIG. 2 shows a method of programming four-level data in the flash memory.
Figure 2:
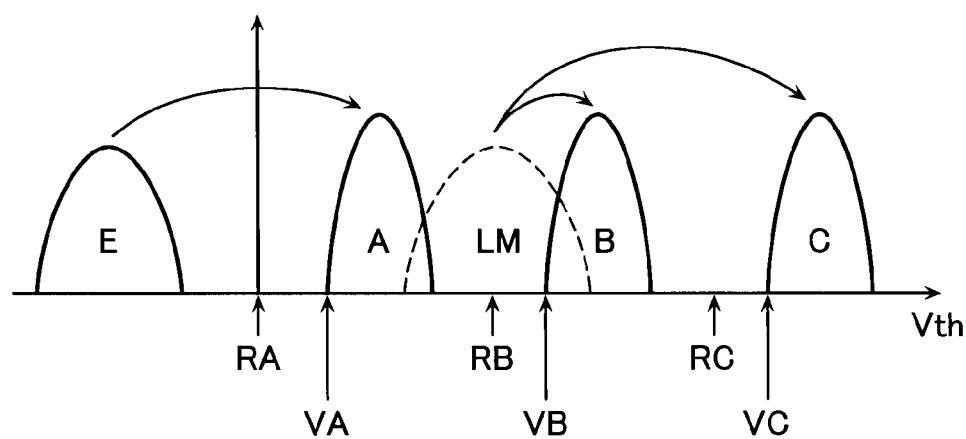

FIG. 2 shows a data programming (or writing) method of the NAND-type flash memory in accordance with this embodiment, to which a four-level data storage scheme is adapted.

Four-level data are defined as data state (i.e., erase state) E with a negative threshold voltage, and data states A, B and C with positive threshold voltages, respectively. In the following description, a "data state" defined by a cell's threshold voltage level will be referred to as a "data level" or a "threshold level", or a "level" simply.

To program the above-described four-level data, all cells in a selected block are initially set to be in data state E with a negative threshold voltage. This is so-called data erase. This data erase is performed in such a way as to apply positive erase voltage Vera to the p-type well, on which the cell array is formed; and apply 0V to all word lines in the selected block, thereby discharging electrons in the floating gates of all cells.

Following it, lower page program, LP-PRG, is performed to program a medium level LM set between data levels A and B into a part of cells with data level E; and then upper page program, UP-PRG, is performed to increase the data levels from E to A, and from LM to B or C.

The above described data program is performed in such a manner as to apply program voltage VPGM to a selected word line; apply program pass voltage Vpass to non-selected word lines; and apply Vss (in case of "0" program necessary for increasing the cell threshold voltage) or Vdd (in case of program inhibiting, i.e., not increasing the cell threshold voltage), thereby selectively injecting electrons into floating gates of the selected memory cells.

In case of "0" program, Vss applied to the bit line is transferred to the NAND cell channel. Therefore, in a "0" program cell, to which program voltage VPGM is applied, electrons are injected into the floating gate from the cell channel. By contrast, in case of "1" program (i.e., program-inhibit), the NAND cell channel will be boosted to Vdd-Vth (Vth: threshold voltage of the select gate transistor), and set to be floating. Therefore, in a "1" program cell, to which program voltage VPGM is applied, the cell channel is boosted by capacitive coupling from the word line, so that electron injection will not occur.

Figure 3:
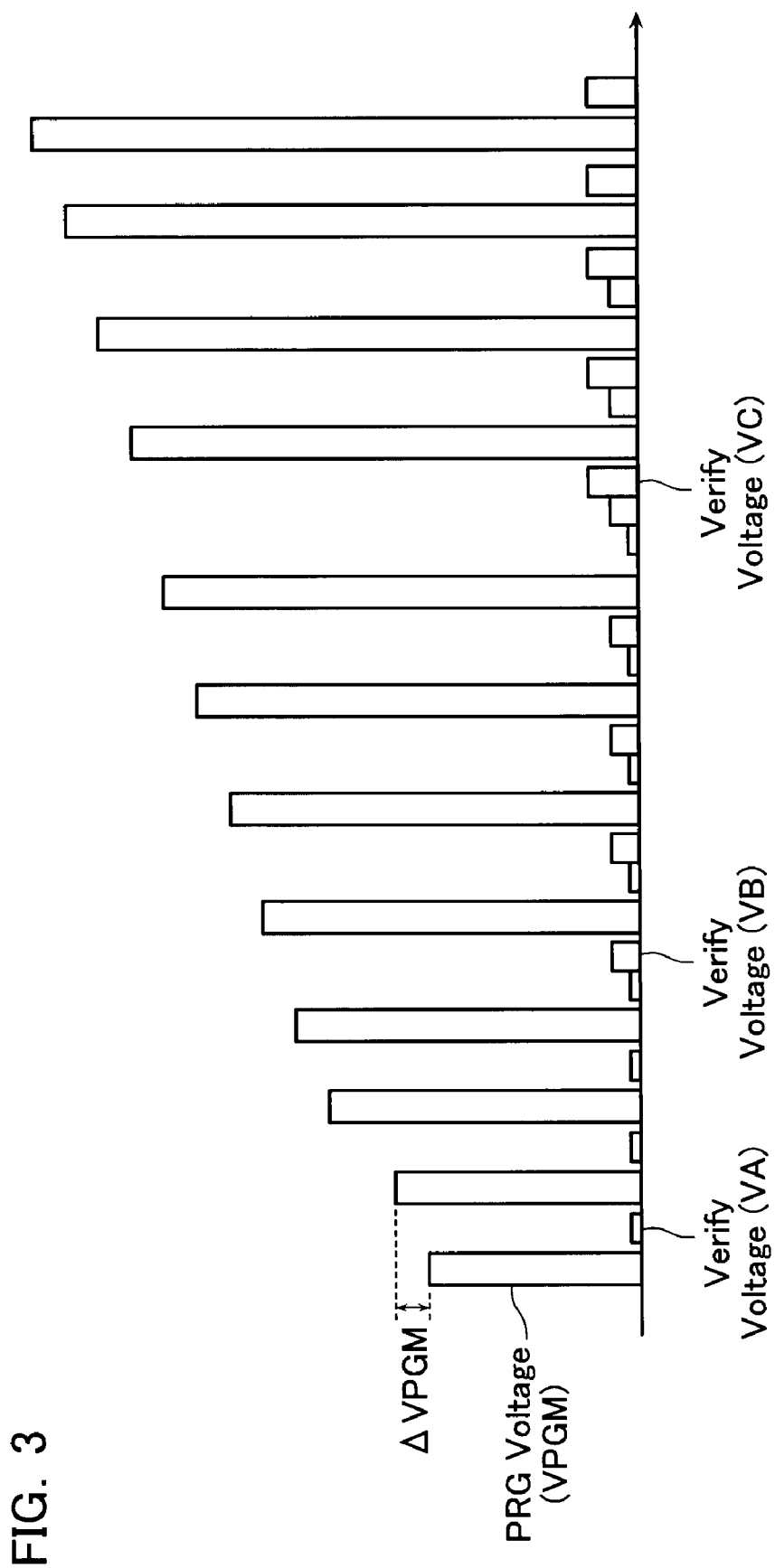
FIG. 3 shows a change of the program voltage and verify voltage in the method.

In the program sequence, it is usually used a step-up program scheme, in which the program voltage is stepped-up little by little every program cycle. FIG. 3 shows program voltage and verify voltage changes in a conventional upper page program with the step-up program scheme.

At the lower page program (i.e., data state LM program) time, the program state is verified with verify voltage VLM corresponding to the lower limit of the program state. That is, when the selected cell is turned on as a result of verify-read with the verify voltage VLM, it will be judged FAIL, while when the selected cell is kept off, it will be judged PASS. Similarly, at the upper page program, data levels A, B and C are verified with verify voltages VA, VB and VC, respectively.

Conventionally, the upper page program finishes in order from the lowest level, i.e., levels A, B and C finish sequentially in program. Therefore, at the beginning of the program cycles, only data level A is subjected to program-verify. At a certain timing, program-verify for level B is added; and program-verify for level C is added further late.

In FIG. 2, it is shown read voltages RA, RB and RC used for reading data after the four-level data programming. In accordance with multiple read operations, which are performed with the read voltages set between data levels and applied to a selected word line, data states E, A, B and C may be detected.

In case the cell array's miniaturization has been advanced, the data variation becomes large due to interference between adjacent cells in the conventional program scheme explained with reference to FIG. 3. Specifically, a so-called "parasitic gate effect" becomes a problem, which occurs between adjacent cells arranged in the word line direction. This problem will be explained in detail below.

Figure 4:
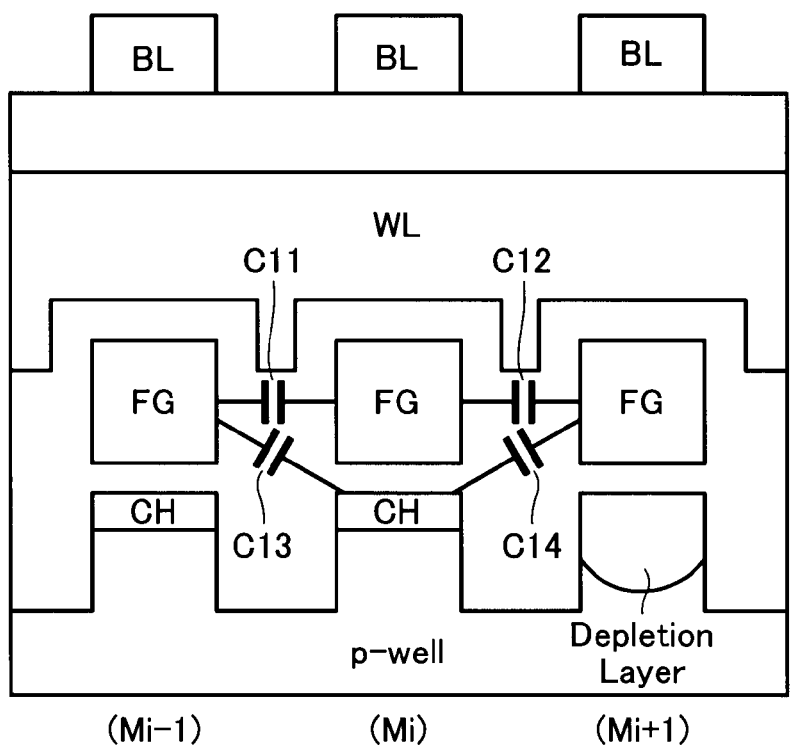
FIG. 4 is a diagram for explaining the interference between cells in the word line direction.

FIG. 4 shows three memory cells Mi-1, Mi and Mi+1 arranged in a section taken along a word line WL. Taking notice of the memory cell Mi, the parasitic gate effect is defined as follows: data of the noticed cell Mi is changed due to coupling capacitances C13 and C14 between the noticed cell's channel CH and the floating gates FG of adjacent cells Mi-1 and Mi+1.

Explaining in detail, it become problematic in such a case that the noticed cell Mi is to be programmed to data state B; and adjacent cell Mi+1 is to be programmed to data state C. In accordance with the program scheme explained with reference to FIG. 3, memory cell Mi, which is programmed to data state B with a relatively lower threshold level, reaches the target threshold voltage prior to the memory cell Mi+1. At this timing, memory cell Mi+1 would have about the same threshold voltage as memory cell Mi. Therefore, when reading with read voltage RC at the program finished timing of memory cell Mi, the adjacent cell Mi+1 is turned on, i.e., the channel is formed under the cell Mi+1.

By contrast, when reading with read voltage RC after the adjacent cell Mi+1 has been programmed to data state C, memory cell Mi+1 is not turned on, and a depletion layer is formed under the gate. Due to capacitive coupling via the above-described depletion layer, capacitance C14 becomes large, so that the potential of the floating gate of memory cell Mi+1 strongly affects the channel potential of memory cell Mi. In other words, the threshold voltage of the noticed cell Mi shifts to be a substantially higher level than that at the program-finished time.

If this parasitic gate effect is large, the memory cell programmed to data state B may be erroneously read in such a way that it becomes an off-cell at a read time with the read voltage RC. This leads to reliability reduction.

Note here that coupling capacitances C11 and C12 between adjacent floating gates cause for data changing after programming in addition to the coupling capacitances C13 and C14 between the adjacent floating gates and the cell channel.

Figure 5:
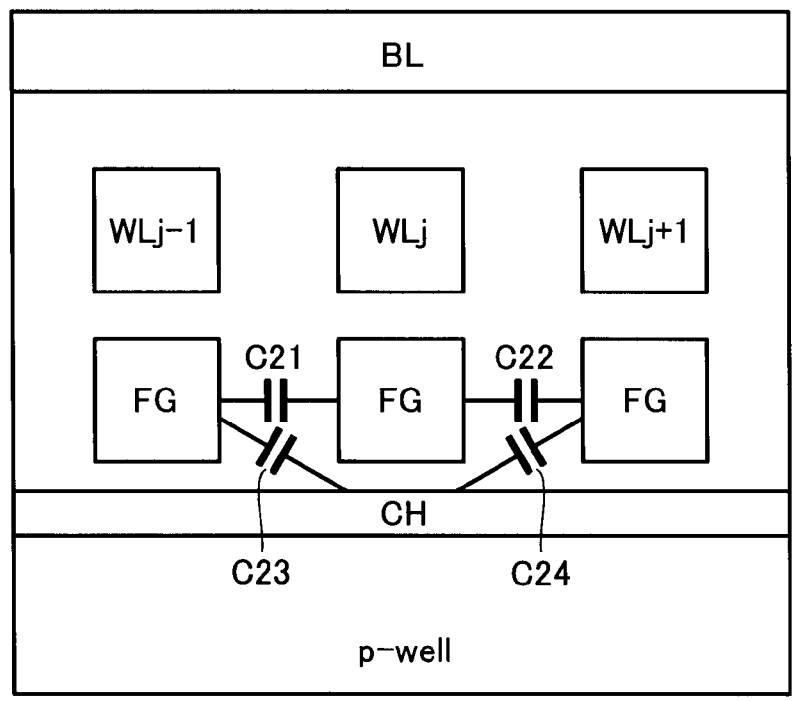
FIG. 5 is a diagram for explaining the interference between cells in the bit line direction.

So far, interference between adjacent cells arranged in the word line direction has been explained with reference to FIG. 4. As shown in FIG. 5, there are coupling capacitances C21, C22, C23 and C24 between adjacent cells in the bit line direction, and these also cause for changing the data threshold level. However, non-selected cells adjacent to a selected cell in the bit line direction are applied with read pass voltage Vread at a read time and surely turned on. Therefore, the parasitic gate defect due to these capacitances C21-C24 is negligibly smaller than that between adjacent cells in the word line direction.

To reduce the parasitic gate effect explained with reference to FIG. 4, in the programming scheme in accordance with this embodiment, multiple data levels will be programmed in order from the upper level side.

Figure 6:
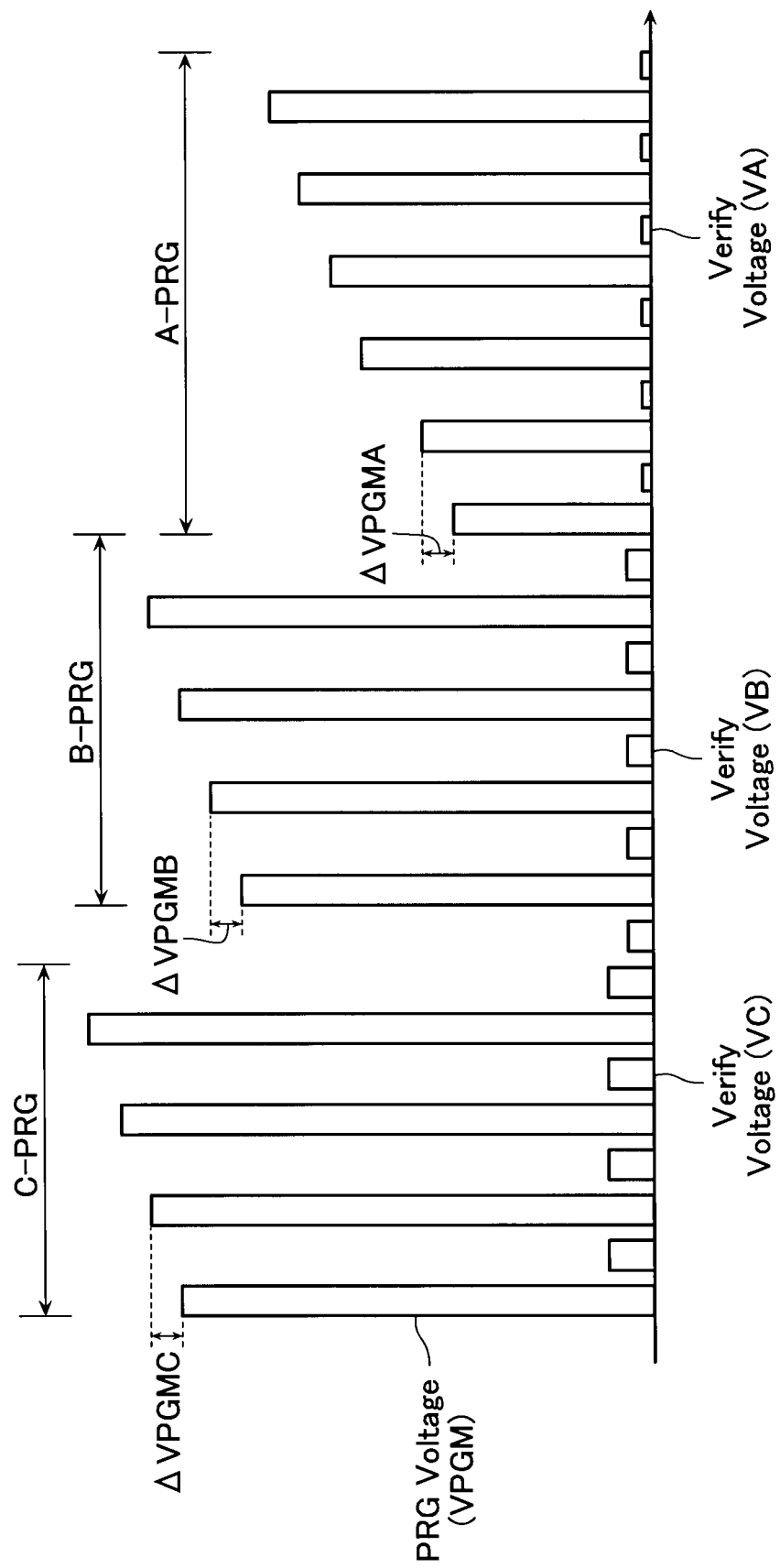
FIG. 6 is a diagram for explaining the programming method of the embodiment.

FIG. 6 shows operation voltage waveforms of an upper page program in accordance with this embodiment in comparison with those shown in FIG. 3. It is assumed here that the lower page program for cells, which are to be programmed to data levels B and C, has already been completed.

The upper page program starts from the uppermost threshold level C (C-PRG). At this time, memory cells to be programmed to levels E, A and B are set in a program-inhibiting state.

After finishing the program for all cells to be set at level C, start level B programming (B-PRG). Note here at this time that it is in need of considering the following situation: there is a possibility of that a part of cells to be programmed to level B has already been programmed in the lower page program cycle. Therefore, before starting the program voltage application, perform program-verify with verify voltage VB. After setting level B programmed cells in the lower page program cycle and level C programmed cells in the preceding step to be in the program-inhibiting state together with ones to be programmed to levels A and C, start the level B program.

After finishing the program for all cells to be set at level B, start level C programming (C-PRG). This program is also performed under the condition that cells to be programmed to level E, B and C are set in the program-inhibiting state.

Figure 7:
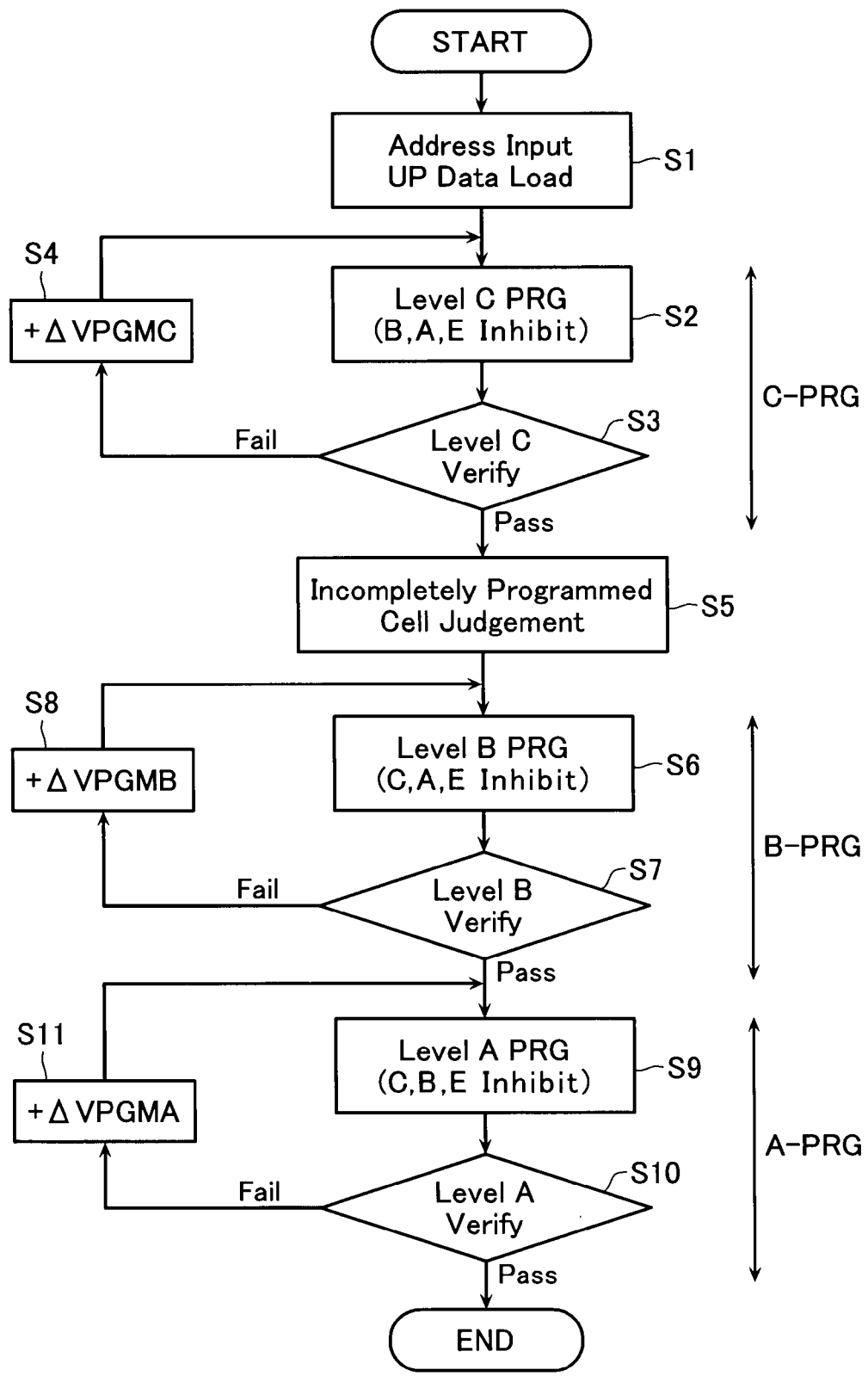
FIG. 7 shows a program sequence in the embodiment.

FIG. 7 shows the above-described upper page program sequence. Inputting address, and loading the upper page (UP) data (step S1), the upper page program starts. According to a data processing in the sense amplifier circuit, only level C program cells are set in a "0" program state while the remaining cells are set in the program-inhibiting state, and then level C program starts (step S2).

After programming, perform verify-read for cells to be programmed to level C (step S3). If there is an incompletely programmed cell, step-up the program voltage by $\Delta$VPGMC (step S4), and program level C again for only the incompletely programmed cell (step S2).

After completing the level C program (all cells programmed), perform verify-read for cells to be programmed to level B (step S5). This is because of: there is, as described above, possibility that a part of cells to be programmed to level B has already been programmed to level B. At this verify step, un-programmed cells are selected in the cells to be programmed to level B, and these are subjected to level B programming (step S6). At this step, level B, C programmed cells and cells to be programmed to level E, A are set in the program-inhibiting state.

Thereafter, perform verify-read for the level B (step S7). If there is an incompletely programmed cell, step-up the program voltage by $\Delta$VPGMB (step S8), and program level B again for only the incompletely programmed cell (step S6). This cycle is repeated until detecting that there is no incompletely programmed cell.

After completing the level B program (all cells programmed), program level A (step S9), and perform program-verify (step S10). If there is an incompletely programmed cell, step-up the program voltage by $\Delta$VPGMA (step S11), and program level A again for only the incompletely programmed cell (step S9). This cycle is repeated until detecting that there is no incompletely programmed cell.

According to the above-described programming, it never occurs such a situation that, after having programmed the noticed memory cell Mi shown in FIG. 4, the adjacent memory cell Mi+1 is programmed to a higher threshold level than that of Mi. Therefore, with respect to the cells arranged along a selected word line, the parasitic gate effect may be effectively reduced.

In the conventional upper page program scheme explained with reference to FIG. 3, the program sequence starts from a low program voltage VPRM, and it is stepped-up by a constant step-up voltage $\Delta$VPGM, whereby levels A, B and C are sequentially programmed. Therefore, it is difficult to use desirable program voltages VPGM and step-up voltages $\Delta$VPGM for the respective data levels A, B and C.

By contrast, in case of the program scheme explained with reference to FIGS. 6 and 7, simultaneously programmed cells belong to only one threshold level to-be-programmed because the program is performed in order from the highest target threshold level. Therefore, it is able to set desirable program voltages VPGM and step-up voltages $\Delta$VPGM for the respective data levels A, B and C.

Explaining in detail, level C is the highest threshold level, and it will be permitted to make the threshold distribution broad. Accordingly, it is permissible to make the step-up voltage $\Delta$VPGMC large for the level C programming.

On the other hands, since level B is sandwiched between levels A and C, it is desired to control the threshold distribution to be narrower. Further, since level A program is performed after level B programming, the level B tends to be widened in threshold due to under the influence of an adjacent cell, which has been programmed to level A. Considering these situations, level B should be programmed with a step-up program voltage $\Delta$VPGMB smaller than $\Delta$VPGMC.

Since threshold level A is finally programmed, the interference effect is less. Therefore, $\Delta$VPGMA may be selected to be larger than that of level B program. Summarizing those, the step-up voltages will be selected to satisfy the following relationship of: $\Delta VPGMB < \Delta VPGMA < \Delta VPGMC$.

As describe above, making the program voltages optimum, it becomes possible to achieve high-speed programming.

While there is mo more than one initial program voltage in the scheme, in which program is performed in order from the lower target threshold side, in case program is performed in order from the higher threshold side, it is desirable to set initial program voltages to be suitable for the target threshold voltages, respectively, and it is possible to do so. If starting from a low initial program voltage in case of programming a high target threshold voltage, it takes many steps to reach the target threshold voltage, and the program time becomes long.

In order to set an initial program voltage to be suitable, the following method will be used.

Figure 8:
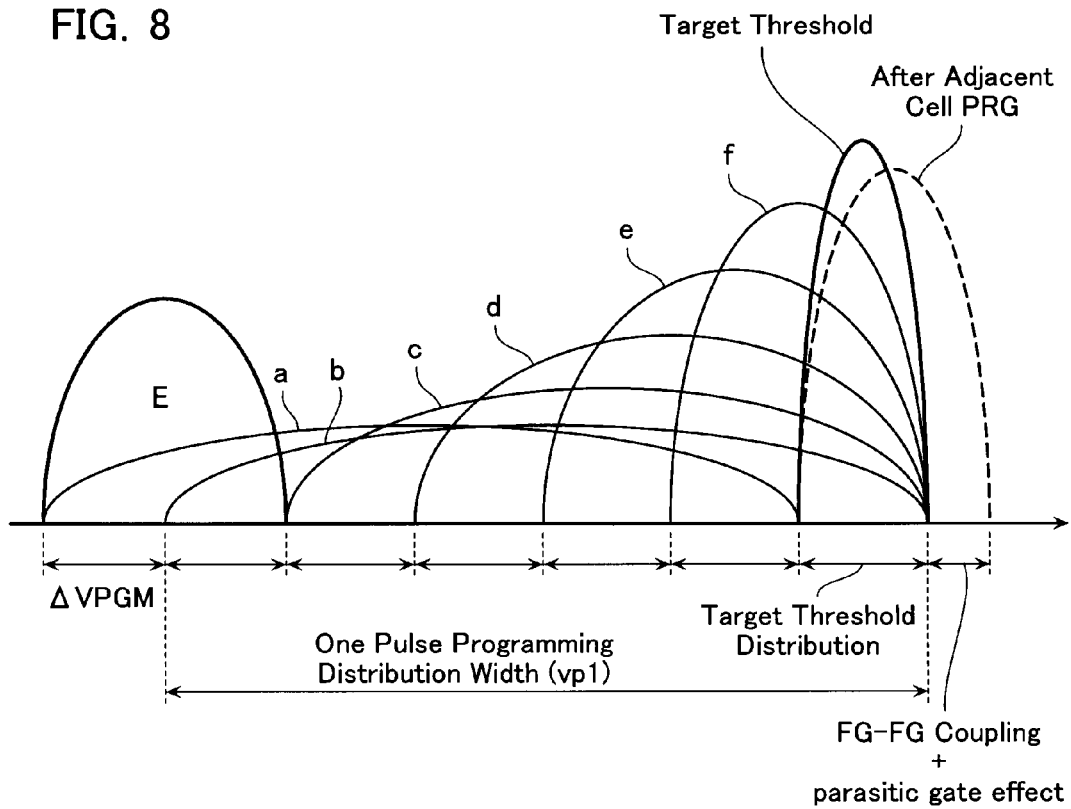
FIG. 8 shows a data threshold change in the program sequence used for explaining the program voltage setting scheme.

FIG. 8 shows a threshold distribution change in the program cycles from the erase level E to a target threshold level. Threshold distribution "a" is one obtained in program steps, in which there are no verify-passed cells. Threshold distribution "b" is a result of a program step, in which there has been generated a verify-passed cell (or cells) first. Via the successive program cycles, in which the program voltages are sequentially stepped-up by $\Delta VPGM$, with threshold distributions "c" to "f", a desired target threshold voltage may be obtained.

The number of program cycles, CAVP, necessary for programming a desired target threshold voltage, is expressed by the following expression (1) with a distribution width "vp1" corresponding to the threshold distribution "b" ("vp1" is referred to as one pulse programming distribution width hereinafter) and program voltage step $\Delta VPGM$.

$$CAVP = CNVP + vp1/\Delta VPGM \tag{1}$$

In the expression (1), CNVP is the number of program cycles required for generating an initially verify-passed cell. If CNVP is zero, the number of program cycles, CAVP, which is necessary for programming a desired target threshold voltage, is obtained by dividing "vp1" by $\Delta VPGM$.

It is able to know the value of CNVP by detecting that a verify-passed cell has been generated. The total program cycle number CAVP will be known by detecting a state where all memory cells (note that these may include defective cells under a certain permissible number) have been verify-passed.

These program cycle numbers CNVP and CAVP may be obtained in the program sequence of the lower page level LM, and these data are held in suitable data latches. These values are deferent from each other depending on which area is selected in the chip, or which word line is selected in a block. Therefore, CNVP and CAVP obtained in the lower page program should be held until the upper page program ends for the same word line.

By use of these program cycle numbers CNVP and CAVP, and step-up voltage $\Delta VPGML$ and initial program voltage F_VPGML used in the lower page program, it is possible to estimate a suitable initial program voltage in the upper page program. Note here that threshold shift due to capacitive coupling between floating gates (FG-FG coupling) and the parasitic gate effect is considered $\Delta VIF$. As shown in FIG. 2, verify voltages for data levels LM, A, B and C are referred to as VLM, VA, VB and VC, respectively.

Initially, with respect to the threshold level C program, a suitable initial program voltage F_VPGMC is obtained as follows:

$$F\_VPGMC = (F\_VPGML + CNVP \times \Delta VPGML) + (VC - VLM - \Delta VPGML) - \Delta VIF + \Delta VPGMC \tag{2}$$

In the expression (2), the first term on the right side, ($F\_VPGML + CNVP \times \Delta VPGML$), is an amending part of the initial value based on the result of the lower page program while the second term, ($VC-VLM-\Delta VPGML$), is a result of considering the level difference between levels C and LM.

Level B is obtained by shifting the level LM of the lower page program a little. Therefore, a suitable initial program voltage F_VPGMB for programming level B is expressed as follows:

$$F\_VPGMB = (F\_VPGML + CNVP \times \Delta VPGML) - \Delta VIF \tag{3}$$

With respect to cells to be programmed to level A, taking notice that verify level VA is lower than level LM by (VLM−VA), initial program voltage F_VPGMA is represented by the following expression (4).

$$F\_VPGMA = (F\_VPGML + CNVP \times \Delta VPGML) - (VLM - VA) - \Delta VIF + \Delta VPGMA \tag{4}$$

As explained above, by use of the program condition data in the lower page program, it is possible to set suitable initial program voltages for the respective target threshold voltages in the upper page program. In other words, it is able to achieve suitable threshold value distributions without waste program time.

Embodiment 2

In the Embodiment 1, 4-level data program is performed with a lower page program for programming the medium level LM; and an upper page program. In this Embodiment 2, it will be explained such a program scheme that data states A, B and C are programmed directly from data state E, i.e., so-called "straight program scheme".

Figure 9:
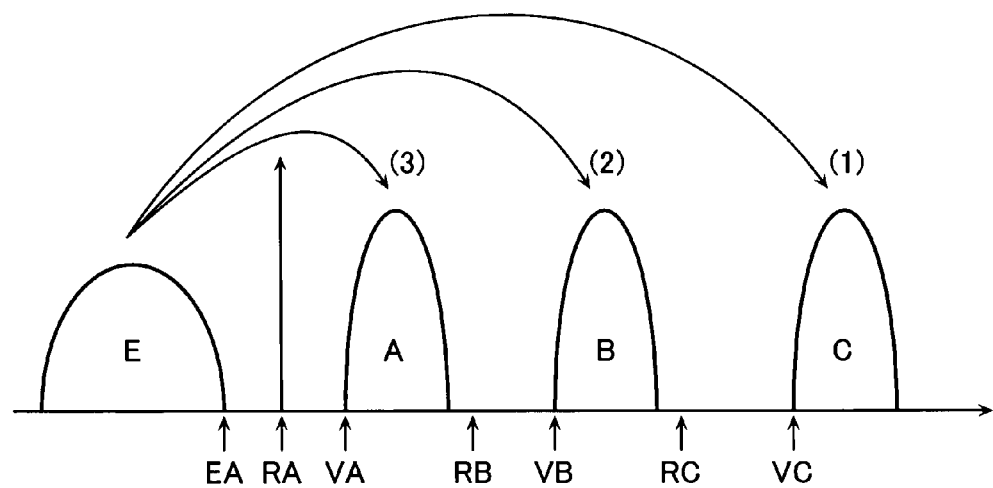
FIG. 9 is a diagram for explaining another method of programming four-level data.

FIG. 9 shows 4-level data E, A, B and C in the straight program scheme. This data level relationship itself is the same as that in the above-described Embodiment 1. Program (1) from data E to data C; program (2) from data E to data B; and program (3) from data E to data A, are sequentially performed in this embodiment.

Figure 10:
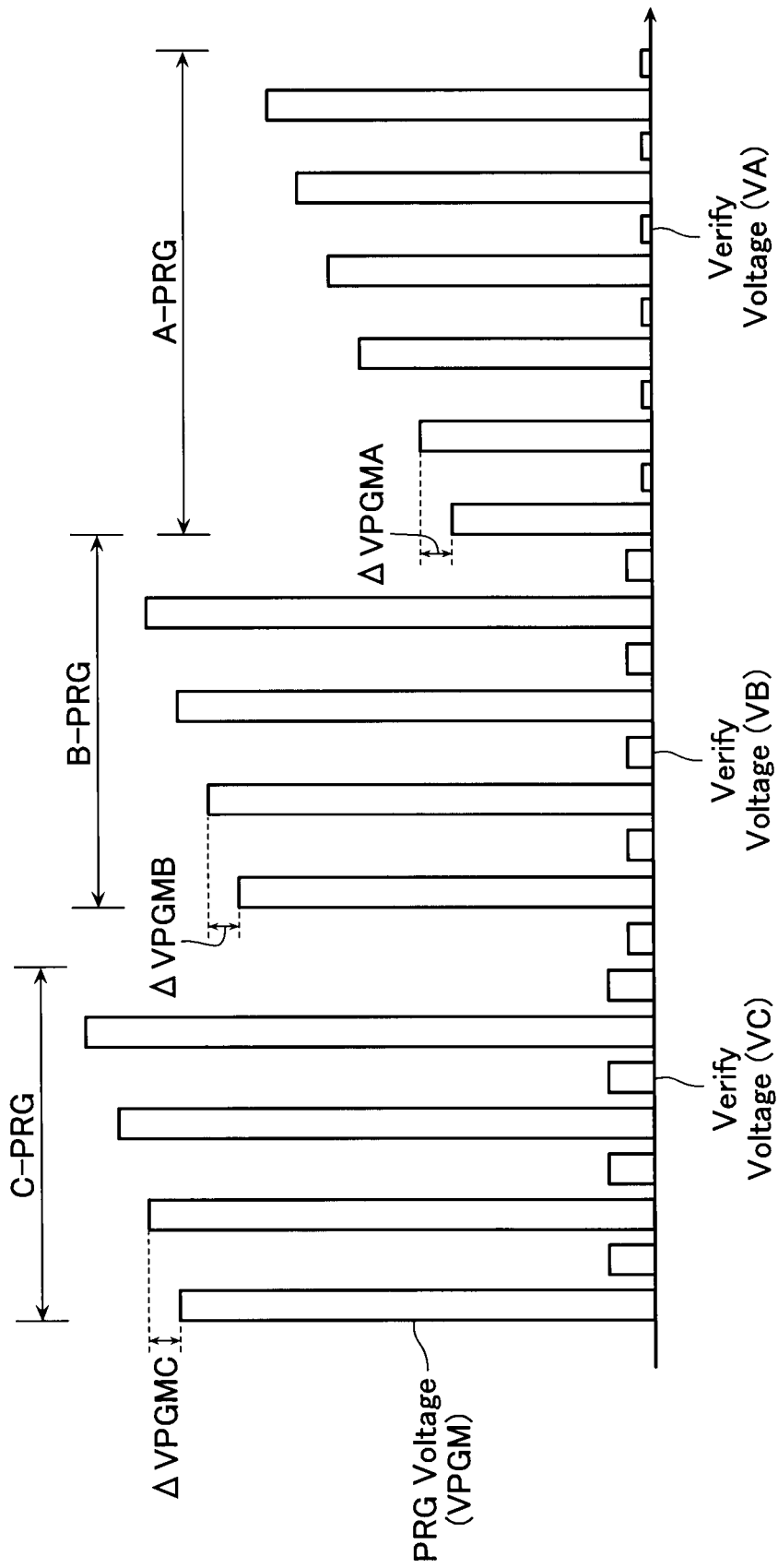
FIG. 10 is a diagram for explaining the four-level data programming, to which the programming method is adapted.

FIG. 10 shows program voltage waveforms in this straight program scheme. Program (1) from data E to data C (i.e., C-PRG), program (2) from data E to data B (i.e., B-PRG) and program (3) from data E to data A (i.e., A-PRG) are performed similarly to the upper page program in the above-described embodiment.

Data program is performed in order from the highest data level, so that the parasitic gate effect is reduced like the above-described Embodiment 1.

Note here that no lower page program is used in this embodiment, and there is no program condition data to be referred to, which is obtained in the lower page program. Inn this Embodiment, to get the program cycle numbers CNVP and CAVP required to set initial program voltages, the following method will be used.

a first method is: to perform the medium level (LM) program once in spite of the straight program scheme. In the above-described Embodiment 1, the lower page program and the upper page program sequences are independent of each other.

By contrast, in this Embodiment 2, the medium level LM program is a so-called "dummy lower page program", so that it does not end, and followed by programming levels C, B and A. As similar to the Embodiment 1, referring to the medium level program, it is possible to get the program cycles numbers CNVP and CAVP, and initial program voltages of data level C, B and A will be set with reference to them.

In the straight program, it leads to reduction of the program performance that the medium level LM program is performed once.

A second method for avoiding the above-described situation is: to get the program cycle numbers CNVP and CAVP based on the first target level C program without performing the medium level LM program. By use of these data, program conditions of the successive programs for levels B and A will be set.

In the straight program, to make the program speed higher, it is desired to apply suitable program voltages for the respective data levels from the beginnings of these cycles. For this purpose, it is in need of previously getting the program cycle numbers CNVP and CAVP.

In consideration of this, a third method is: to get the program cycle numbers CNVP and CAVP based on a program test in a wafer-stage of the NAND-type flash memory. For example, perform the wafer test for multiple areas in the chip, and get the program cycle numbers CNVP and CAVP for the respective areas.

Thus gotten data are stored in a ROM fuse area in the flash memory chip, and automatically read out to be stored in a certain data latch circuit at a power-on resetting time. These data in the data latch circuit are supplied to the controller in the chip when a program command is input for each corresponding area, and the controller sets suitable program conditions for the respective areas.

The program test should be preferably performed for multiple areas in a block. The reason is as follows: as shown in FIG. 1, each NAND cell unit has select gates at the both ends, and program properties at the center portion and the both edge portions are often different from each other. Based on the result of the above-described test program, each the program cycle number data is obtained in practice, for example, as an averaged value, or the maximum or minimum value. This data will be finally stored in the ROM fuse area.

According to this Embodiment 2, the parasitic gate effect may also be reduced, and improved 4-level data program becomes possible.

Embodiment 3

A program performance will be determined by that how many program cycles are required for programming a data threshold distribution. That is, the less the number of program cycles, the higher the program performance.

As shown in the expression (1), the number of the entire program cycles, CAVP, required for programming a threshold level is defined by the number of program cycles, CNVP, during there is no verify-passed cell, one pulse programming distribution width "vp1" and the program voltage step $\Delta$VPGM. To make the waste program cycle number CNVP less, it is required to apply a suitable initial program voltage for obtaining a target threshold level. This will be solved in accordance with the methods explained in the Embodiments 1 and 2.

The step-up voltage $\Delta$VPGM is determined by how wide is required for the final threshold distribution. In such a multi-level data storage NAND-type flash memory that stores n($\geq$2) bits/cell, it is required to arrange threshold distributions with the number of the square of "n" in a voltage range, so that each threshold distribution is required to be made narrow.

The distribution width "vp1" is determined by cell properties. The cell properties are, for example, a coupling ratio between the control gate and floating gate, a variation of an intrinsic threshold distribution (in the erase state with ultraviolet rays) and the like. As the cell miniaturization is advanced, the variations of the memory cell structure and the ion implantation affect the cell properties strongly, so that the one pulse programming distribution width "vp1" tends to be widened. The fact that the distribution width "vp1" is widened means that there is a program-completed cell with a low program voltage while the remaining cells are not program-completed without a high program voltage.

In this embodiment, to program cells in the above-described wide threshold distribution at a high rate, a method of judging the cell's program speed is used as explained below.

Figure 11:
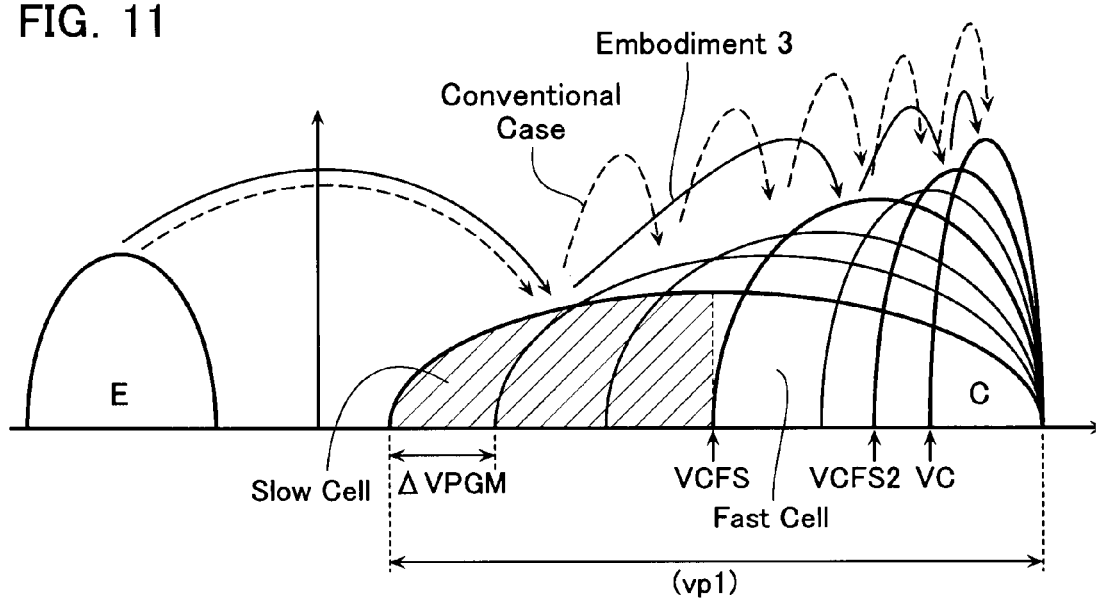
FIG. 11 shows the threshold changes with the FSR programming and conventional programming methods.

As shown in FIG. 11, in case of programming cells from data level E to data level C, the distribution width "vp1" is obtained at one program cycle. Assuming that the center level of the one pulse programming distribution width "vp1" is VCFS, memory cells with threshold voltages lower than VCFS may be called as relatively low program speed cells (referred to as low-speed cells or "slow cells" hereinafter) while memory cells with threshold voltages higher than VCFS may be called as relatively high program speed cells (referred to as high-speed cells or "fast cells" hereinafter).

Distinguish between the slow and fast cells, and change the program conditions between the slow and fast cells, and it becomes possible to perform efficiently high speed program.

A to-be-solved problem in this case is in that what level is VCFS. In a practical program of a NAND-type flash memory, the one pulse programming distribution width becomes different dependent on the block and word line positions. Therefore, the program cycle numbers CNVP and CAVP are also used in this case.

If CNVP, CAVP and $\Delta$VPGM are searched, the one pulse programming distribution width "vp1" will be obtained by use of the expression (1). With these values, VCFS is obtained as follows:

$$VCFS = VC - vp1/2 + \Delta VPGM \qquad (5)$$

Supposing that the same straight program as the Embodiment 2 is used, for example, with respect to programming level C, program-verify is performed with two verify voltages VCFS and VC, and the following program operation is divided into three modes as follows.

First, program is stopped for a memory cell, which reached the verify voltage VC.

Second, with respect to the fast cells, program voltage F_VPGMC+$\Delta$VPGM, i.e., initial program voltage F_VPGMC is stepped-up by $\Delta$VPGM, is used.

Third, with respect to the slow cells, program voltage F_VPGMC+vp1/2, which is lower than that of the fast cells by vp1/2−$\Delta$VPGM, is used.

As described above, the fast cell and the slow cell are subjected to different program conditions, but these program voltages are stepped-up by the same voltage $\Delta$VPGM. This program scheme will be referred to as an "FSR program (FSR-PRG)" hereinafter.

In FIG. 11, a threshold change after VCFS judgment in accordance with the FSR program is shown by solid line arrows while another threshold change in the conventional case (for example, in the straight program explained in Embodiment 2) are shown by dotted line arrows. It should be appreciated that it becomes possible to do high-speed program with the FSR program.

Figure 12:
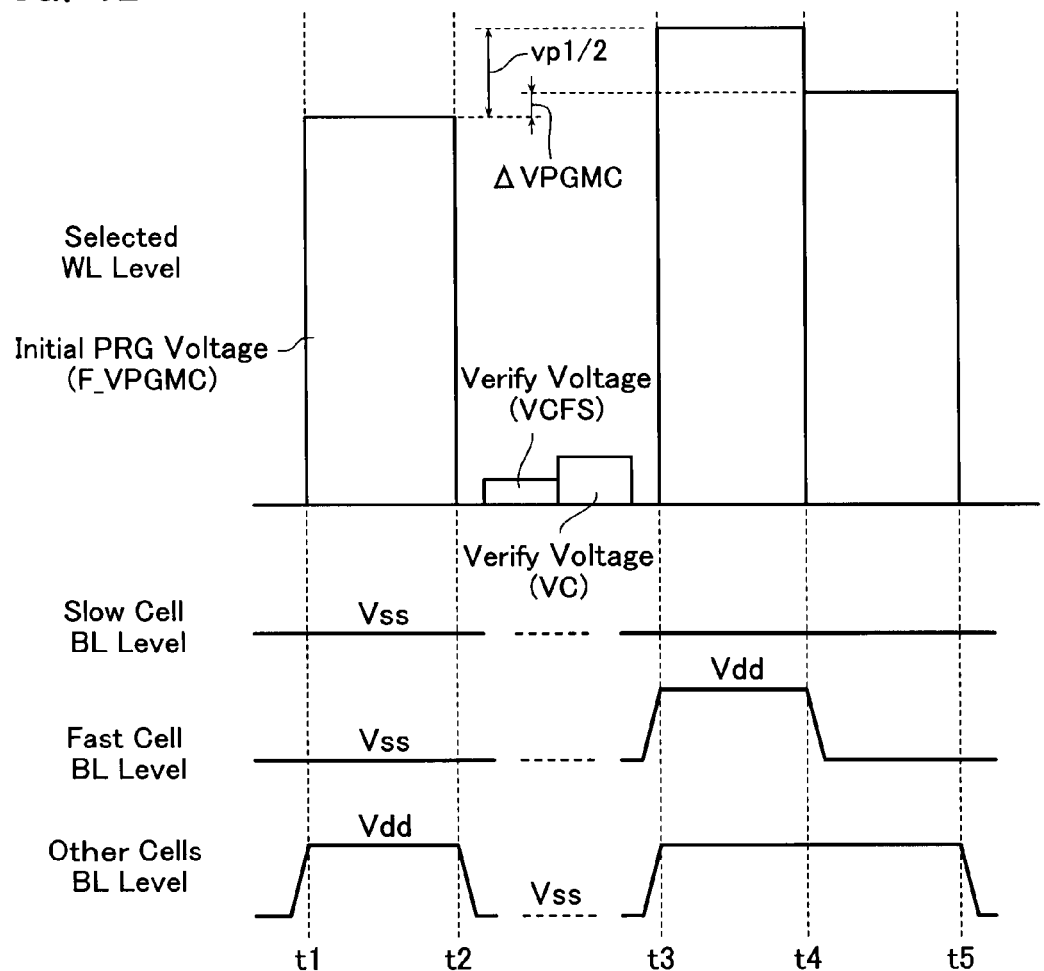
FIG. 12 shows voltage waveforms of a word line and bit lines in the FSR programming mode.

FIG. 12 shows voltage waveforms of a selected word line and bit lines in the FSR program cycle. In case of level C programming, a bit line(s) corresponding to a cell(s) to be programmed to level C is set at Vss while the remaining bit lines are set at Vdd (program inhibiting). During t1-t2, the selected word line is applied with program voltage (initial value) F_VPGMC. After programming, verify-reads are performed at VCFS level and VC level (during t2-t3).

At the following program timing t3, memory cells to be programmed to other levels except level C (i.e., program inhibiting cells) and memory cells (fast cells), which are to be programmed to level C with a threshold level higher than VCFS, are set in a program inhibiting state, where bit lines are set at Vdd. Memory cells (slow cells), which are to be programmed to level C with a threshold level lower than VCFS, are set in a "0" program state, where bit lines are set at Vss.

During program time t3-t4, the selected word line is applied with program voltage F_VPGMC+vp1/2. Programmed at this time are slow cells only in the memory cells, which are to be programmed to level C.

At timing t4, bit lines corresponding to fast cells in the memory cells, which are to be programmed to level C, are stepped-down to Vss, and the selected word line is stepped-down to F_VPGM+$\Delta$VPGMC. With this voltage change, the fast cells are programmed.

When the fast cells are programmed, the slow cells are programmed simultaneously under the same condition. However, since the program voltage is stepped-down to be lower than that at the slow cell programming time, the slow cells are hard to be programmed. Therefore, the threshold voltage of the slow cells will not be increased at this program time.

As described above, in accordance with such a method that a high word line voltage is set first for the slow cell programming, and then it is stepped-down for the fast cell programming, the word line voltage transition may be made fast. The reason is as follows: in case an NMOS transistor is used in the word line driver, voltage stepping-down may be made faster than voltage stepping-up.

The same explanation as the word line voltage transition may be adapted to the bit line voltage transition. That is, the slow cells are programmed first under the condition that the bit lines corresponding to the fast cells are set at Vdd, and then the Vdd bit lines are stepped-down to Vss for programming the fast cells. Accordingly, the bit line voltage transition may be made fast with the same reason as the case of the above-described word line voltage transition.

Figure 13:
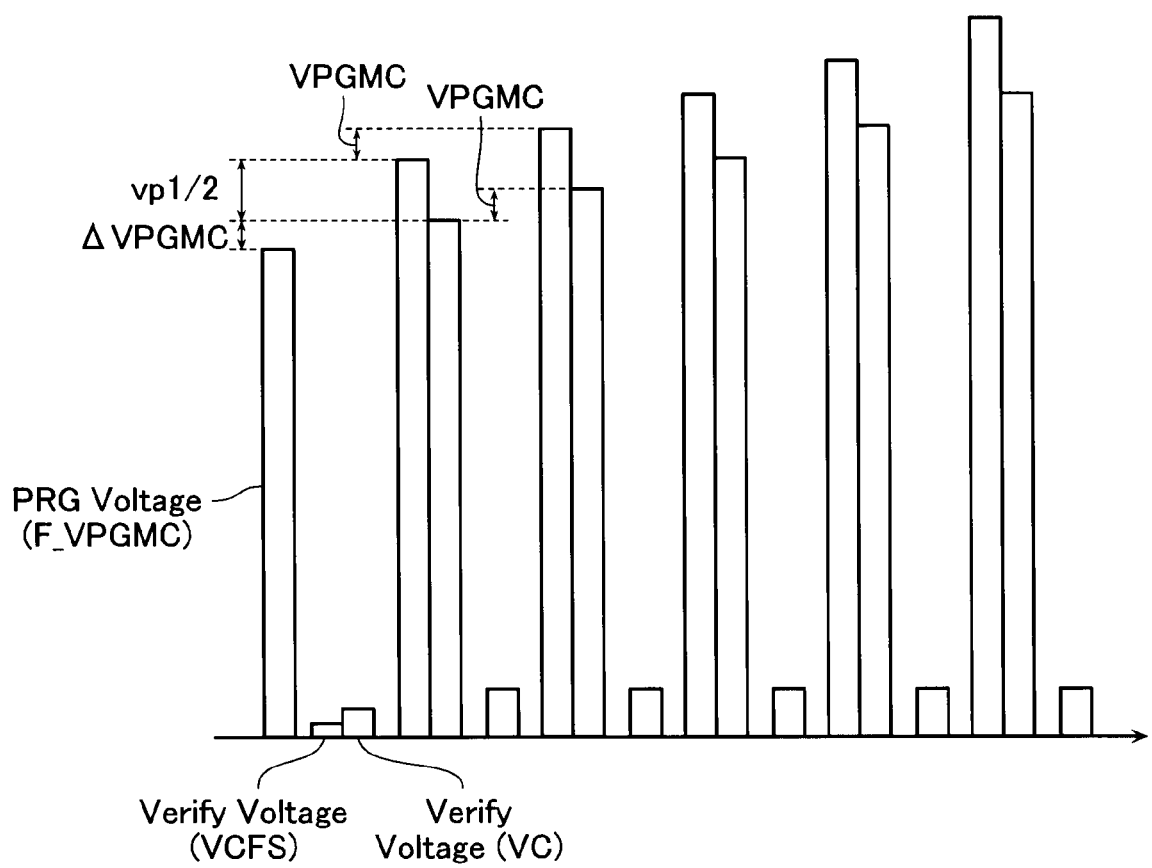
FIG. 13 shows voltage waveforms of the word line in the FSR programming mode.
Figure 14:
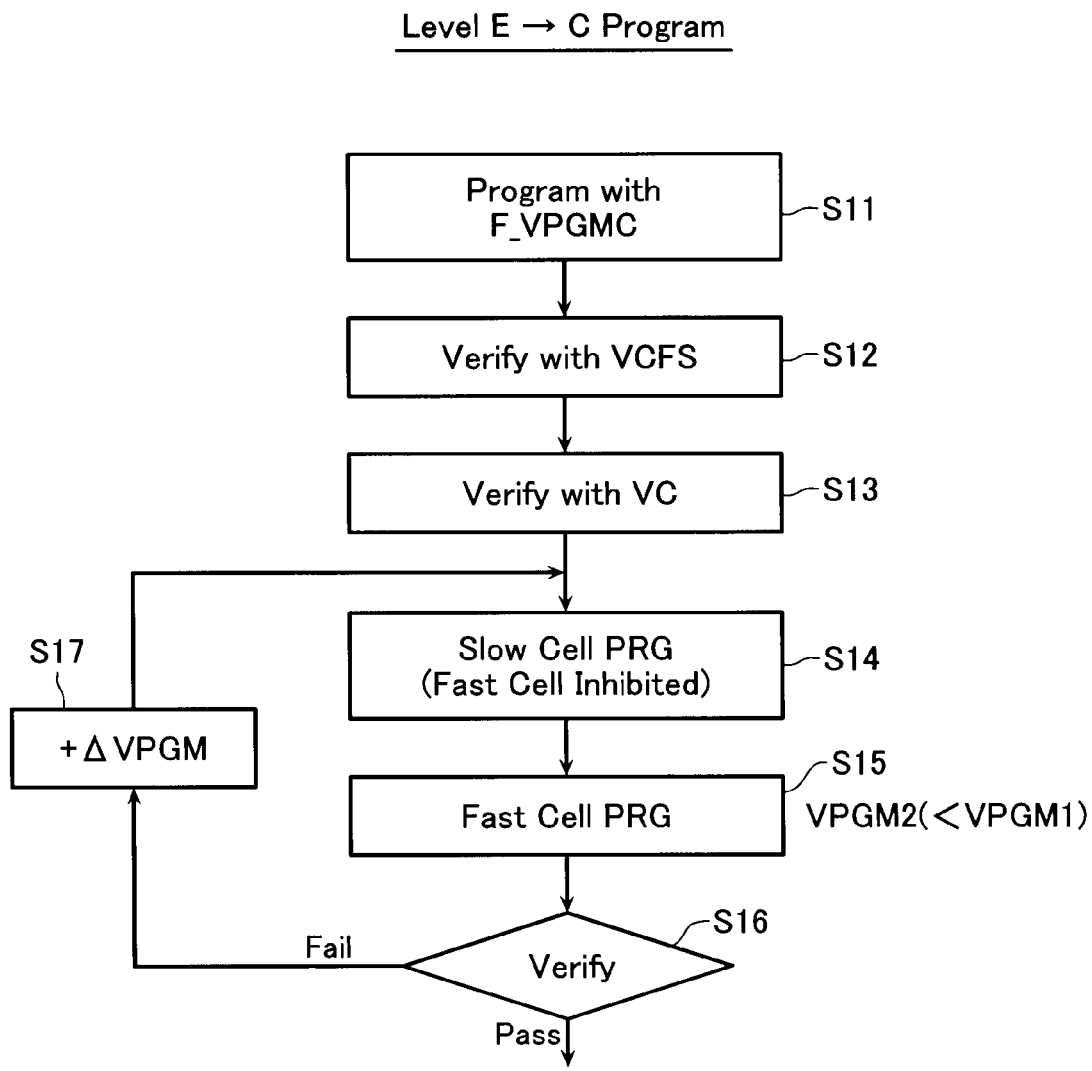
FIG. 14 shows a program control sequence in accordance with the FSR programming.

FIG. 13 shows the voltage waveforms in the successive program cycles with the same conditions as above-described; and FIG. 14 shows the program flow. Apply the initial program voltage F_VPGMC to a selected word line to program cells to be programmed to level C (step S11). Then distinguish between the fast cells and slow cells via a verify-read operation with level VCFS (step S12). Following it, program-verify the level C via verify-read with verify voltage VC (step S13).

Following it, set the programmed cells and the fast cells to be in a program-inhibiting state, and program only the slow cells (step S14). Thereafter, program the fast cells (step S15). In these program steps, assuming that the program voltages for the slow cells and fast cells are VPGM1 and VPGM2, respectively, these are set to satisfy the following condition of: VPGM2<VPGM1. Therefore, at the fast cell program step S15, there is no need of setting the slow cells to be in the program-inhibiting state.

Then, perform program verify (step S16). If there is an un-programmed cell, the program voltage is stepped-up by $\Delta$VPGM (step S17), and program cycles will be repeated until the program-verify is passed.

According to this FSR program, it becomes possible to achieve high-speed program because the one pulse programming distribution width may be reduced to about a half value at the next program step. In the example shown in FIG. 11, it is in need of programming and verifying six times for obtaining the target threshold distribution in case of the conventional program scheme (dotted line), while in case of the FSR programming (solid line), the program is completed with four times programming and verifying.

The above-described FSR programming may be effectively adapted for programming not only the uppermost level C but also the successive data levels B and A. With this program scheme, the program speed will be improved. Alternatively, it is also useful that the FSR program is adapted to only the level C program, in which a large level transition occurs.

This FSR program is specifically useful in such a case that the one pulse programming distribution width "vp1" is four times or more than the step-up voltage $\Delta$VPGM.

Note here that it is useful to judge the program speed again after applying the second program voltage as explained in FIGS. 12 and 13. At this time, the current threshold distribution is estimated to be vp1/2, and its central level VCFS2 is represented by the following expression (6).

$$VCFS2=VC-vp1/4+\Delta VPGM \quad (6)$$

Performing the program-verify with this verify voltage VCFS2, it is able to further distinguish between the fast cells and slow cells. Note here that the memory cells judged as the fast cells at this timing may include not only memory cells judged as the fast cells judged at the first program time but also memory cells judged as the slow cells at the first program time, and memory cells judged as the slow cells at this timing may also include not only memory cells judged as the slow cells judged at the first program time but also memory cells judged as the fast cells at the first program time.

To store the above-described cell states, it is further in need of preparing a data latch circuit. In addition, if four word line voltages are used in the following program operation in accordance with two program speed judgments, the operation will be made complicated.

The FSR program scheme in this embodiment is useful not only in the straight program scheme explained in Embodiment 2 but also in the upper page program sequences explained in Embodiment 1.

Embodiment 4

In a conventional NAND-type flash memory, to make the ratio of the memory cell area to the chip area as large as possible, the word line length or the bit line length is made long, so that the row decoder or sense amplifier circuit area is made relatively small. As a result, it takes a very long time to charge a word line and a bit line. It is required of the high-speed programming to reduce these charging times.

One effective method is as follows: without resetting the word line level at each data level programming, programming for multiple data levels is performed continuously within a program pulse, the pulse level of which is changed little by little.

Figure 15:
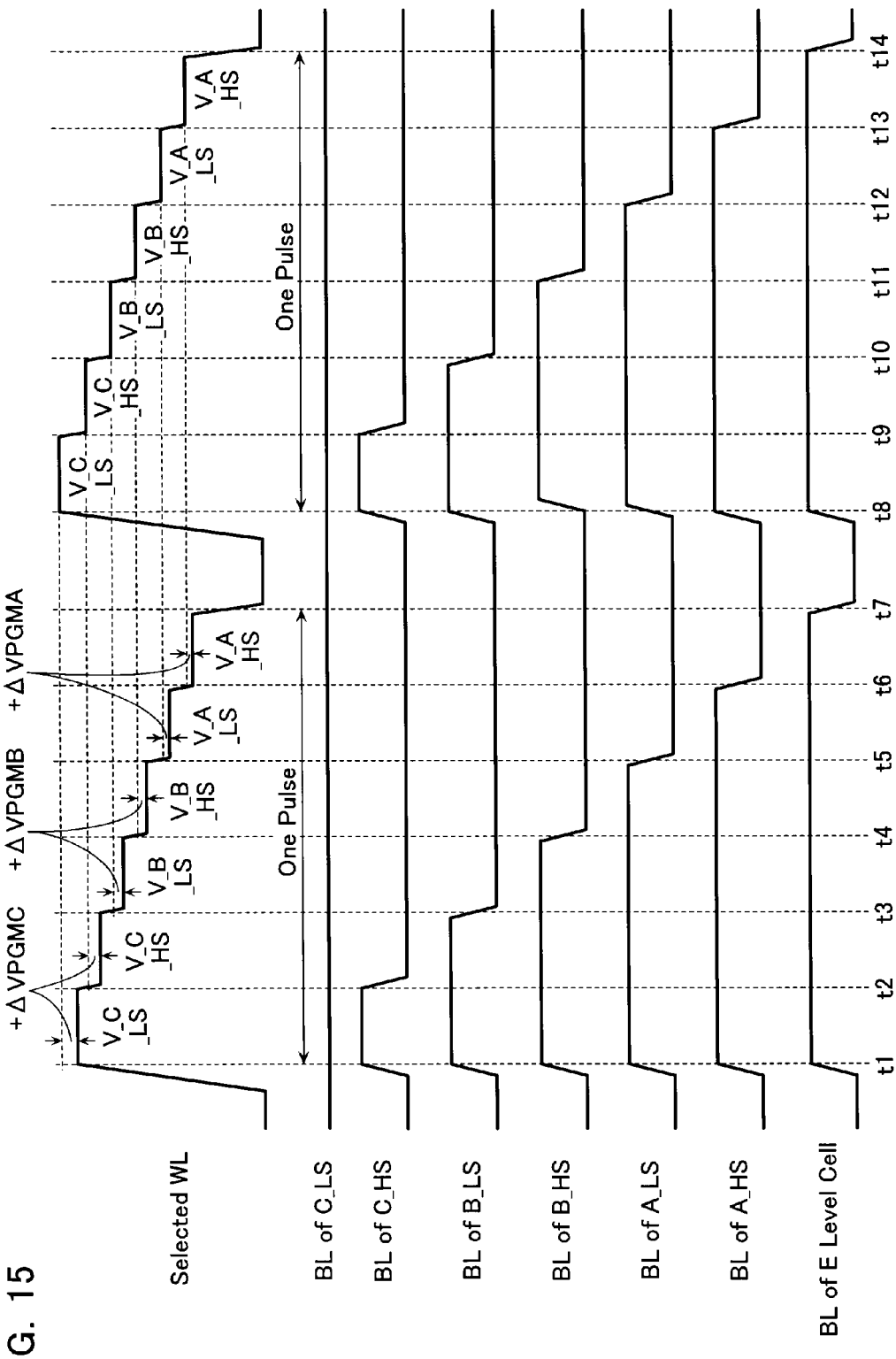
FIG. 15 shows voltage waveforms of a word line and bit lines in another embodiment.

FIG. 15 shows word line and bit line voltage waveforms in this Embodiment 4, in which levels A, B and C in the four-level data shown in FIG. 2 are programmed simultaneously by use of the FSR program scheme explained in the Embodiment 3.

Suppose here that memory cells to be programmed to levels A, B and C have been distinguished between the fast cells and slow cells. It will be used the same distinguishing method as explained in the Embodiment 3. The fast cells and slow cells in memory cells to be programmed to level A are designated as A_HS and A_LS, respectively; the fast cells and slow cells in memory cells to be programmed to level B are designated as B_HS and B_LS, respectively; and the fast cells and slow cells in memory cells to be programmed to level C are designated as C_HS and C_LS, respectively.

During t1 to t7, a program pulse applied to a selected word line is changed in level little by little, and levels A, B and C are programmed. Explaining in detail, bit lines except those corresponding to the slow cells C_LS are charged up to Vdd at timing t1. After the bit line charging, the selected word line is charged up to level V_C_LS for programming C_LS cells.

Next, bit lines corresponding to the fast cells C_HS are discharged to Vss at timing t2, and the selected word line is stepped-down to level V_C_HS for programming C_HS cells at the same time. During t2 to t3, the fast cells C_HC are programmed.

Following it, bit lines corresponding to the slow cells B_LS are discharged to Vss at timing t3, and the program voltage of the selected word line is stepped-down to level V_B_LS for programming B_LS cells at the same time. During t3 to t4, the slow cells B_LC are programmed.

As similar to the above-description, the successive programming is performed as follows: fast cell B_HS programming (t4-t5); slow cell A_LS programming (t5-t6); and fast cell A_HS programming (t6-t7). One program pulse application is continued during t1 to t7.

After applying the program voltage pulse, perform verify-read operations with verify voltages VA, VB and VC (t7-t8). For the respective cells, which are not verify-passed, similar program cycles are repeated with the selected word line program voltages stepped-up by $\Delta$VPGMA, $\Delta$VPGMB and $\Delta$VPGMC for the data levels, respectively.

By use of this program operation, suitable word line voltages may be applied to the respective memory cells to be programmed to levels A, B and C, and the word line or bit line charging time, which becomes an overhead time, may be reduced. Therefore, it becomes possible to program data efficiently.

In the example explained with reference to FIG. 15, levels A, B and C are simultaneously programmed. However, in case the simultaneous programming is performed for all data levels from the beginning, it fears that a level B programming cell is over the threshold level VB prior to when a level C programming cell is over VB.

In this case, assuming that a noticed cell is a level B programming cell, and the adjacent cell in the word line direction is a level C programming cell, the noticed cell is influenced strongly with the parasitic gate effect as explained with reference to FIG. 4.

A program method for avoiding the above-described situation will be explained with reference to FIGS. 16A and 16B.

Figure 16A:
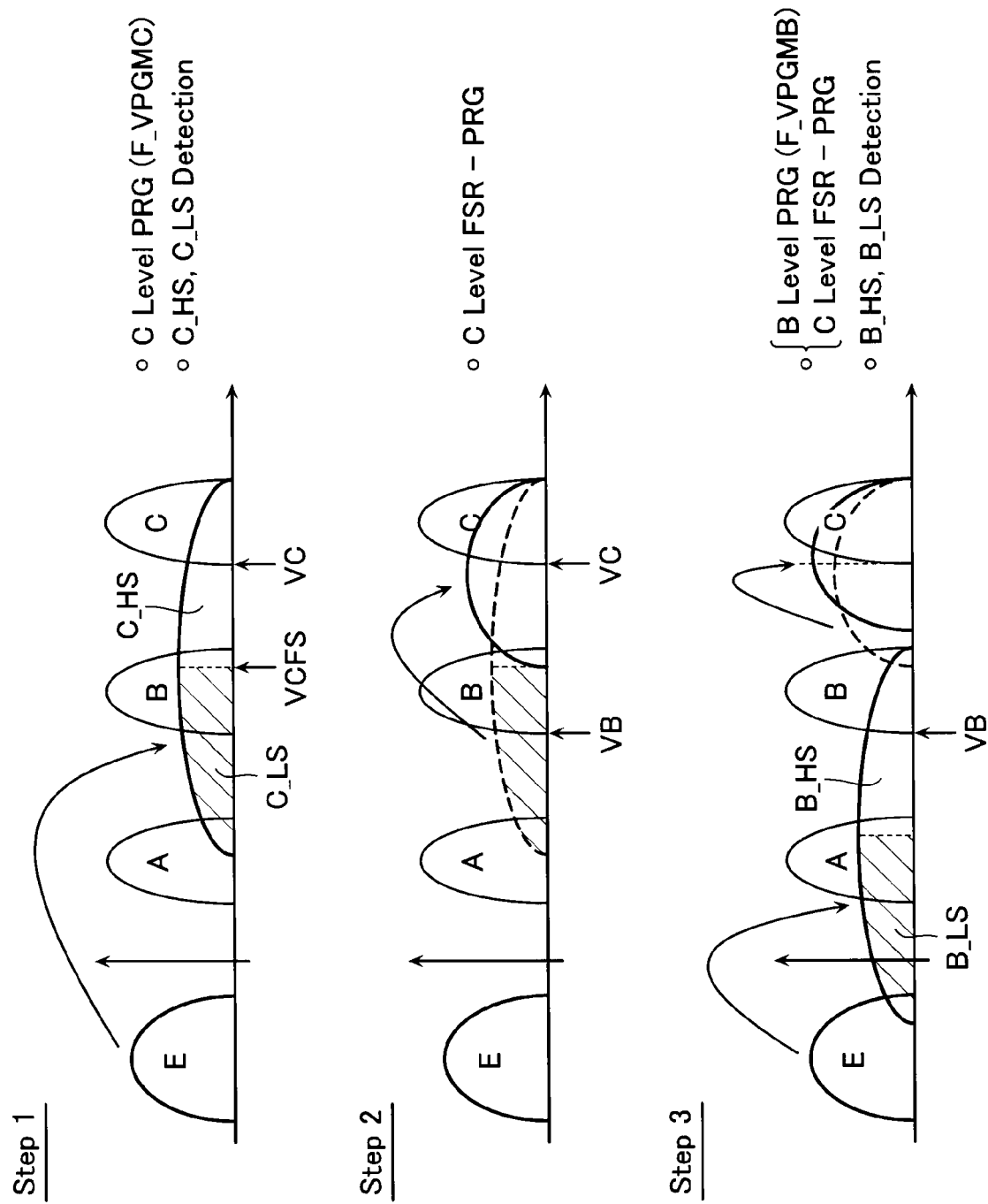
FIGS. 16A and 16B show threshold voltage changes in Step 1-3 and Step 4-6, respectively, in the embodiment.

First, as shown as Step 1 in FIG. 16A, only level C programming cells are programmed. At this time, level B and A programming cells are set in the program-inhibiting state. Program voltage applied to the selected word line is the initial value F_VPGMC obtained in the method explained in the Embodiment 1 or 2.

After this programming, verify-read is performed with verify voltages VC and VCFS as explained in the Embodiment 3. As a result, level C programming cells are divided into the fast cells C_HS and the slow cells C_LS.

Next, as shown as Step 2 in FIG. 16A, the program voltage is stepped-up by $\Delta$VPGMC, and FSR program is performed for level C programming cells. Having finished the program, verify-read is performed with verify voltages VC and VB. The reason of why the verify-read of VB level is performed is to confirm whether the level C programming cells are over the threshold level VB or not.

After detecting all cells to be programmed to level C are over the level VB, start the level B programming at Step 3 shown in FIG. 16A. In this case, the simultaneous program scheme explained in Embodiment 3 is adapted to programming levels C and B. Note, however, that cells to be programmed to level B have not been distinguished between the slow cells and fast cells at this step.

At the verify-read time after programming, the cells to be programmed to level B are distinguished between the fast cells B_HS and slow cells B_LS.

Figure 16B:
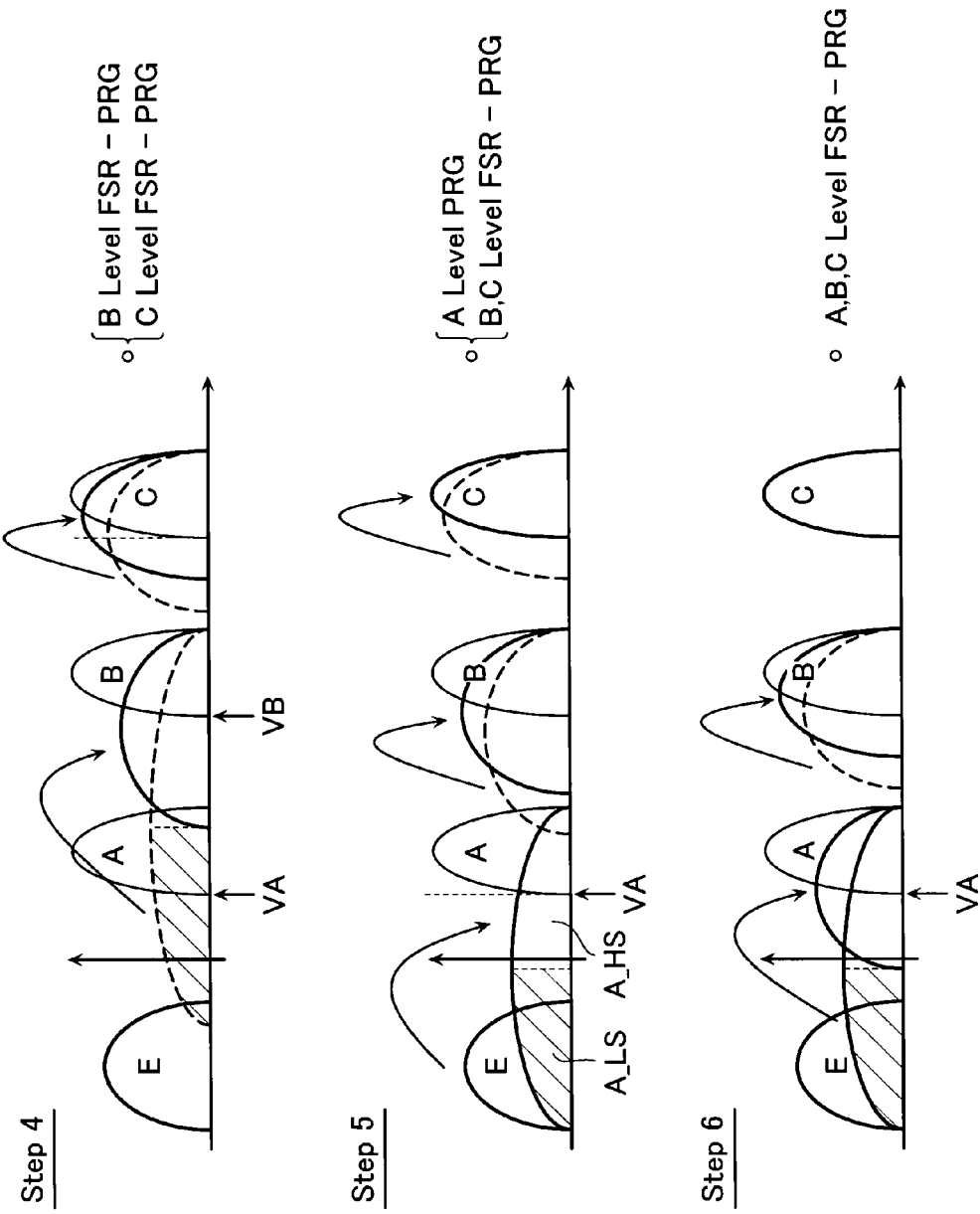

At Step 4 shown in FIG. 16B, level B programming cells (B_HS and B_LS) and level C programming cells (C_HS and C_LS) are subjected simultaneously to FSR programming. After programming, perform verify-read operations with verify voltages VB and VA. The reason of why the verify-read of VA level is performed is to confirm whether the level B programming cells are over the threshold level VA or not.

After detecting that all cells to be programmed to levels B and C are over the level VA, start the level A program defined by Step 5 shown in FIG. 16B. If there are incompletely programmed cells for levels C and B at this step, levels A, B and C are simultaneously programmed as similar to the Embodiment 3. Level B and C program is performed as FSR program.

Performed at the program-verify in this Step 5 with respect to level A programming cells are not only verify-read with verify voltage VA but also program speed verify for distinguishing the slow cells A_LS and fast cells A_HS.

Thereafter, levels A, B and C cells are subjected to FSR program simultaneously. The example of Step 6 shown in FIG. 16B designates that all level C programming cells are verify-passed (program-completed) while level B and C cells are subjected to FSR program.

[Flash Memory Configuration]

A flash memory configuration, to which the above-described Embodiments 1 to 4 are effectively adapted, will be explained in detail below.

Figure 17:
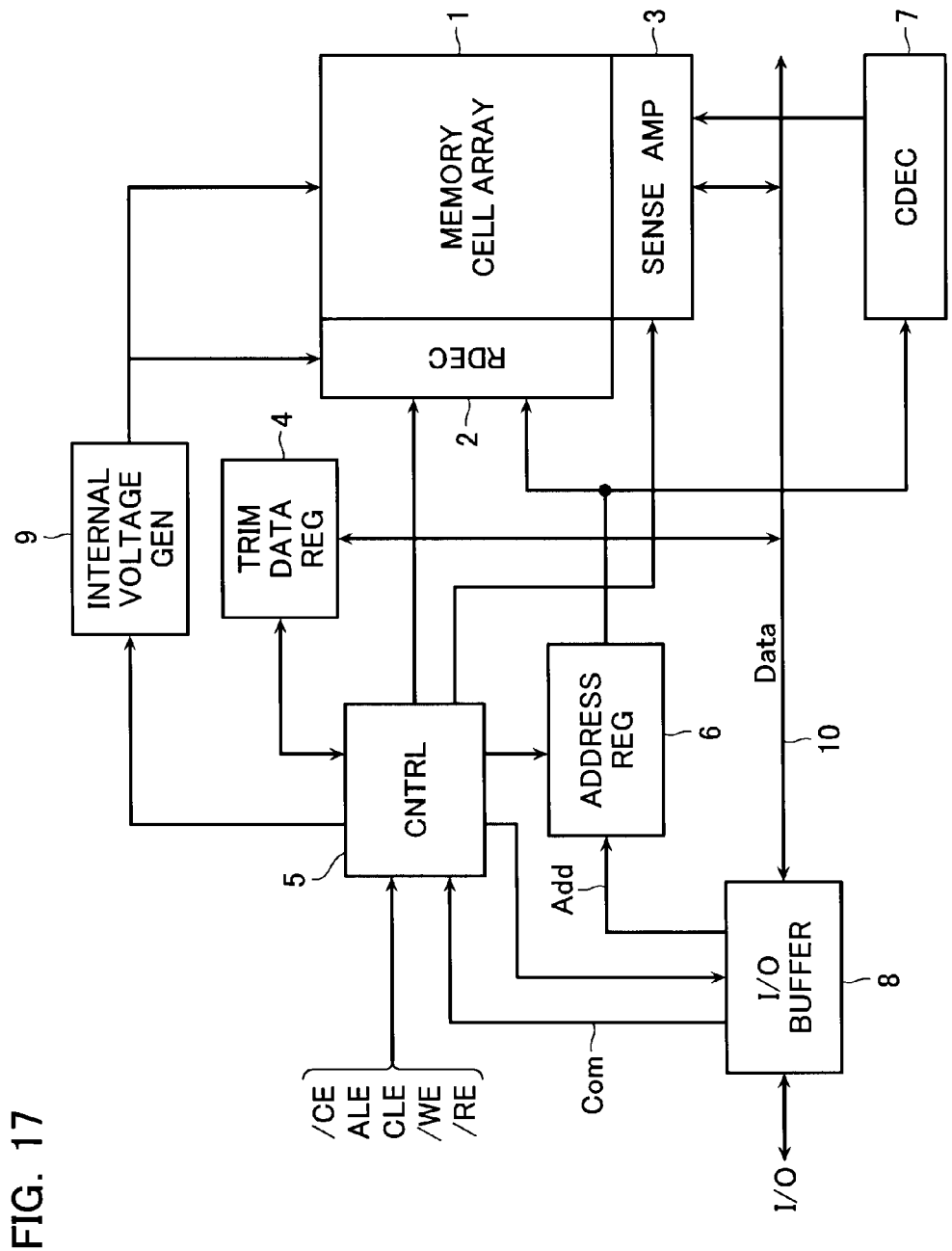
FIG. 17 shows a functional block configuration of the flash memory in accordance with the embodiments.

FIG. 17 shows a functional block configuration of the NAND-type flash memory. The memory core portion including memory cell array 1, row decoder 2 and sense amplifier circuit 3 are the same as explained with reference to FIG. 1. Data transmission between the sense amplifier circuit 3 and external I/O pads is performed via data bus 10 and I/O buffer 8 under the control of column decoder 7.

Input to controller 5, which is an internal control circuit, are many kinds of external control signals (chip enable signal /CE, address latch signal ALE, command latch signal CLE, program enable signal /WE, read enable signal /RE and so on). Controller 5 distinguishes address "Add" and command "Com" supplied from the external in accordance with the above-described control signals, thereby supplying the address to the row decoder 2 and column decoder 7 via address register 6, and decoding the command.

Controller 5 executes data read control, data program-sequence and erase-sequence control. To generate internal voltages (which are boosted to be higher than the power supply voltage) required in the respective operation modes, internal voltage generating circuit 9 is prepared. This internal voltage generating circuit 9 is also controlled by controller 5 to do voltage-boost operations for outputting required voltages.

Trimming data register 4 is disposed to hold many kinds of voltage trimming data and timing trimming data. These data are previously programmed in a ROM area in the memory cell array 1, and automatically read out as a power-on reset operation to be stored in the register 4. The program cycle numbers CNVP and CAVP, which are obtained in the wafer test explained the Embodiment 2, are also stored similarly to the trimming data. Further, some data such as program cycle numbers and the like, which are detected in the program sequences explained in the embodiments, may also be stored temporarily in the register 4.

Figure 18:
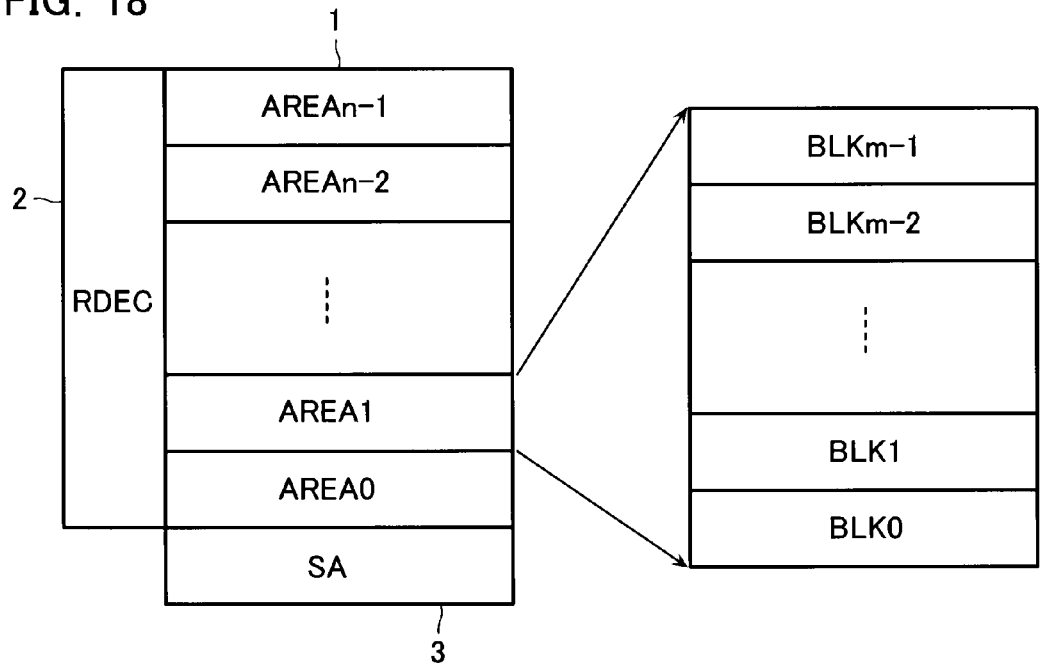
FIG. 18 shows the cell array configuration of the flash memory.

FIG. 18 shows that memory cell array 1 is divided into multiple areas AREA0~AREAn−1, each of which includes multiple blocks BLK0~BLKm−1.

The detailed configuration of the memory cell array 1 and the relationship between memory cell array 1 and sense amplifier circuit 3 have been explained with reference to FIG. 1. The operations in the above-described embodiments may be adaptable in principle in such a configuration that multiple bit lines share a sense amplifier/data latch S/A&DL. However, in case "n" bit lines share a sense amplifier/data latch S/A&DL, the number of memory cells simultaneously programmed is 1/n of the entire memory cells coupled to a word line.

In this case, the previously programmed cells are influenced by the adjacent and lately-programmed cells due to the parasitic gate effect. Therefore, in the example shown in FIG. 1, the entire memory cells coupled to a word line are simultaneously programmed and read out as a page.

Figure 19:
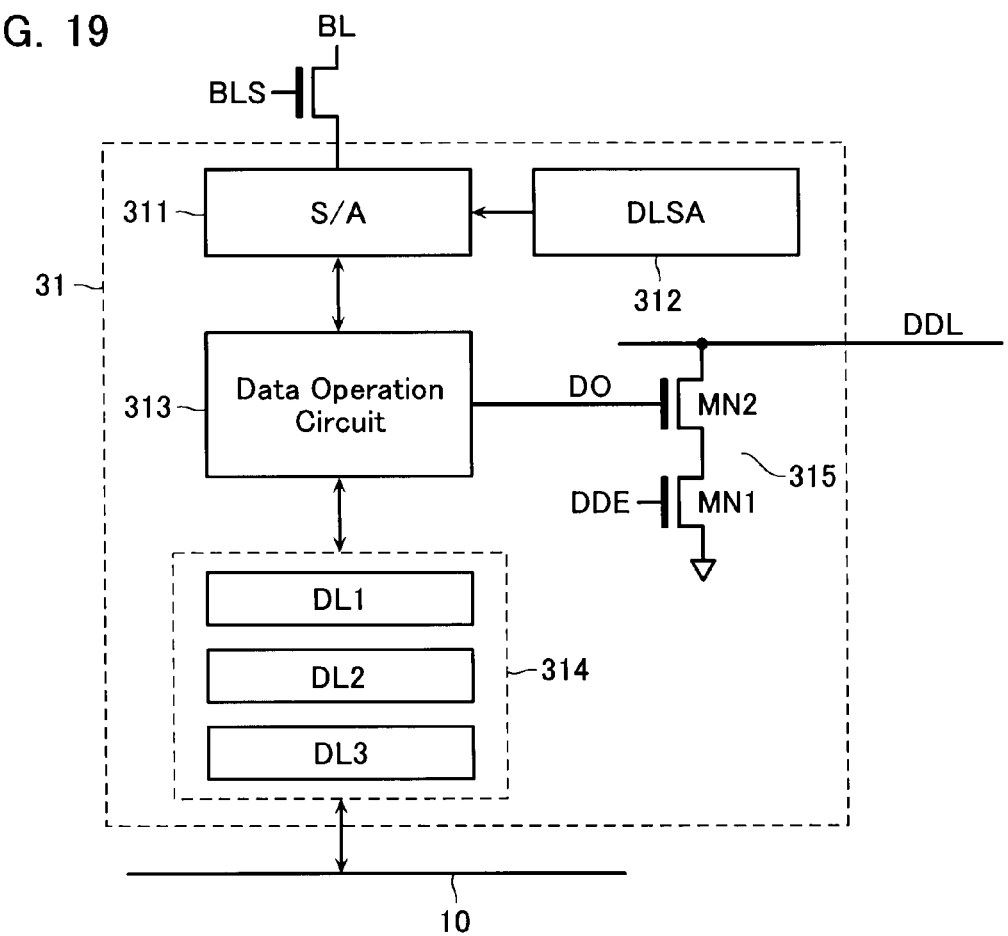
FIG. 19 shows the sense amplifier/data latch configuration of the flash memory.

FIG. 19 shows the configuration of sense amplifier/data latch (S/A&DL) 31.

Sense amplifier 311 is coupled to not only a bit line via a select transistor and but also data latch 312. Data latch 312 is for storing data used for charging/discharging the bit line at a data program time, i.e., program data or amended data thereof, or sensed data.

Sense amplifier 311 is coupled to data storage circuit 314 via data operating circuit 313. It is required of the data storage circuit 314 to include two data latches DL1 and DL2 in case of storing four-level data defined by two bits/cell. In case of Embodiments 3 and 4, it is in need of further including a data latch DL3 for storing program speed data, which designates a fast cell or a slow cell.

Program data transferred via the data bus 10 is loaded in the data storage circuit 314. The program data held in the data storage circuit 314 is amended in practice in accordance with that it belongs to which level data in the multi-level data, and transferred to and held in data latch 312. The data stored in data latch 312 becomes "1" program data (program-inhibiting data) for applying Vdd to the bit line, or "0" program data for applying Vss to the bit line.

There is disposed verify-judging circuit 315 for judging the program completion based on the verify-read data in the program sequence. This verify-judging circuit 315 is also used for judging the program numbers CNVP and CAVP explained in Embodiment 1, as follows:

For example, suppose such a case that verify-read is performed with the lowest threshold voltage, VLM, of the medium level LM as a verify level. If all programmed cells have threshold voltages under VLM, these cells are judged as on-cells. This data is transferred to data operation circuit 313 from the sense amplifier 311.

Data operation circuit 313 is set to output D0="L" when data is judged as an on-cell. Judging signal line DDL, which is prepared in common to all sense amplifiers, is previously charged at Vdd, and judging signal DDE="H" is applied at a judging time. If all cells are under VLM, the signal line DDL is kept at Vdd. By contrast, if at least one cell is over VLM in threshold, D0="H" is output, so that the signal line DDL is discharged to Vss.

As a result, it is able to judge that there is a cell reached to have a threshold voltage over VLM, and it becomes possible to know the program cycle number CNVP based on the result.

After determining the program cycle number CNVP, a logical operation is performed between the verify-read result and the program data in the data operation circuit 313, which outputs D0="L" when the threshold voltage of the memory cell to be programmed to the LM level is over VLM. As a result, in case the entire memory cells are programmed to the LM level, the signal line DDL is kept at Vdd. Based on this result, program completion will be judged, and the program cycle number CAVP will be detected.

In practice, the program cycle numbers CNVP and CAVP are counted by a program cycle counter prepared in the controller 5 shown in FIG. 17, and these values are determined by the output of the signal line DDL. These program cycle numbers are stored in register 4, and used in the program sequences as explained in the Embodiments. That is, based on these program cycle numbers, the internal voltage generating circuit 9 generates a suitable program voltage VPGM.

In case FSR program is performed for level X in the Embodiments 3 and 4, it is also possible to determine the central threshold value VXFS (corresponding to VCFS in case of C level) of the one pulse programming distribution width "vp1" based on the program cycle numbers stored in the register 4. Word line step-up voltage ΔVPGMX and verify voltage VX are previously determined values, which are read out the ROM fuse area and stored in the data register 4 at the power-on time.

By use of these values, it is able to obtain "vp1" in the controller 5, and VXFS may be obtained based on it.

In case a cell threshold is detected as being under VXFS at the FSR program verify-read time, the cell data will be transferred to the data storage circuit 314, for example data latch DL3, via the data operation circuit 313. Data operation circuit 313 obtains the following program data (to be transferred to the bit line) based on data in data latches DL1 to DL3, and transfer it to data latch 312.

That is, data operation circuit 313 performs a logic operation based on data stored in data storage circuit 314 including the verify-read result at each program cycle, and transfers a suitable bit line control data to data latch 312 in time for the following program pulse application. This data in data latch 312 is transferred to the bit line BL, so that a suitable bit line level is set in accordance with program data.

Figure 20:
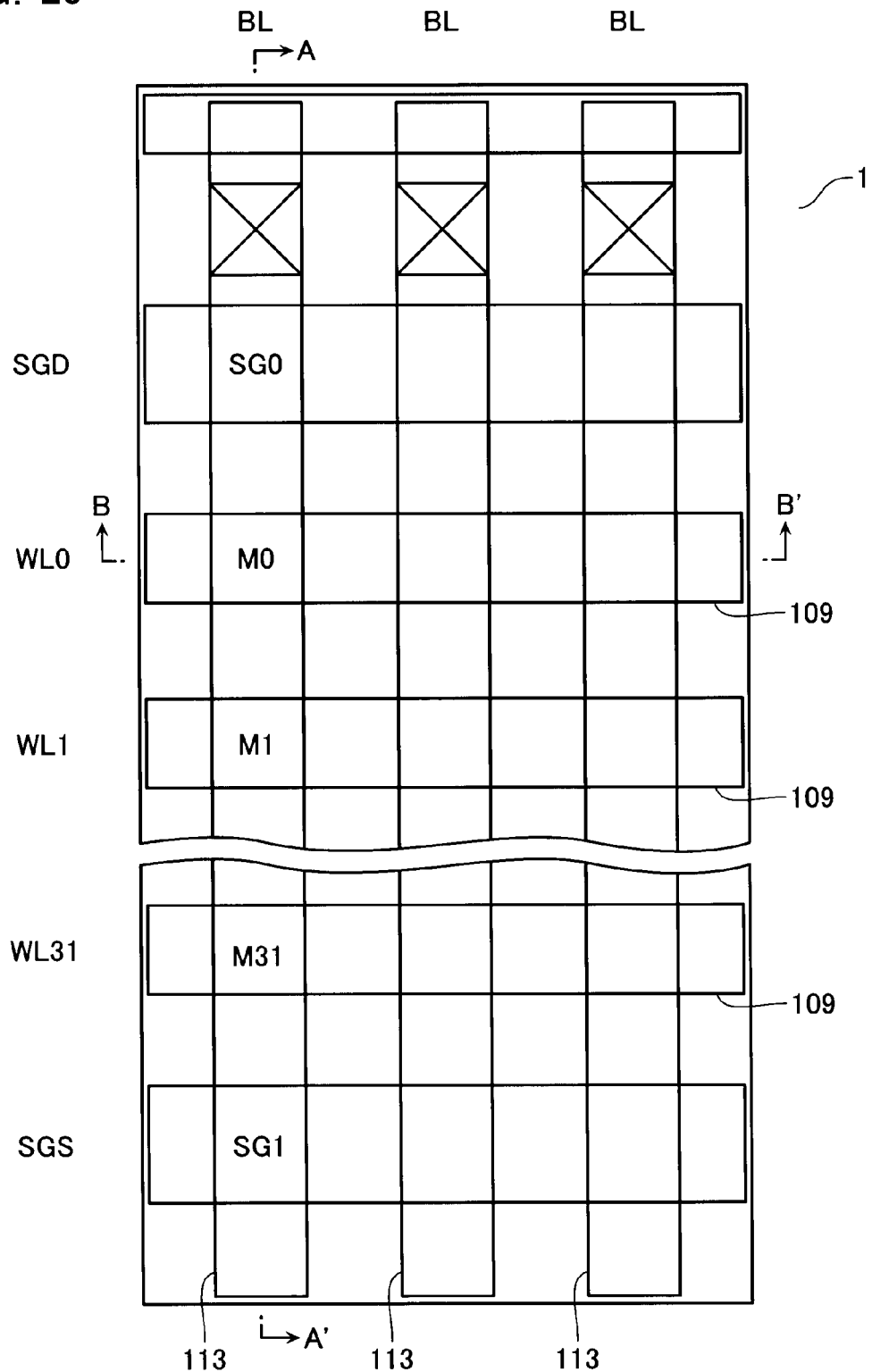
FIG. 20 shows the cell array layout.
Figure 21:
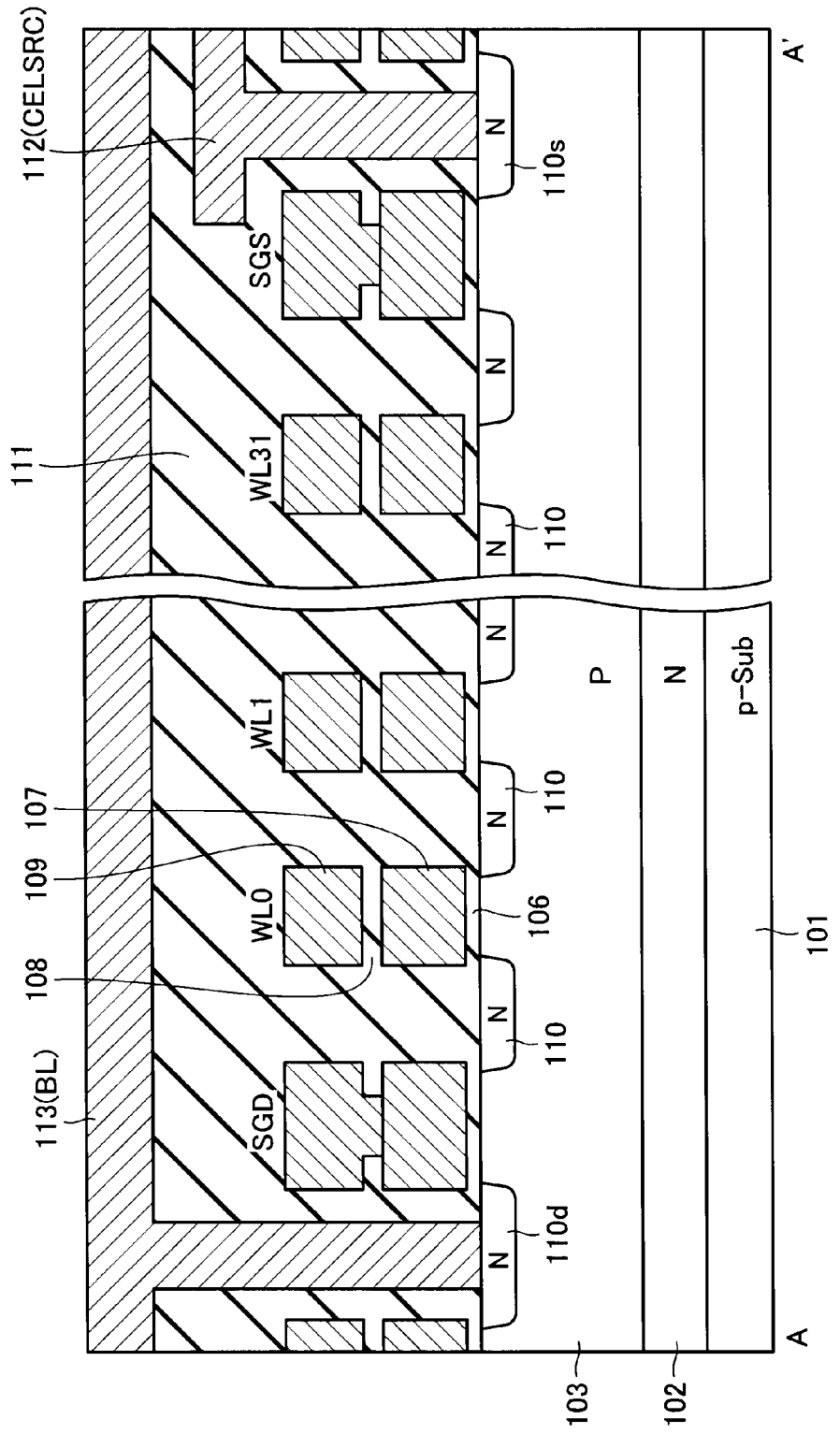
FIG. 21 shows A-A' sectional view of FIG. 20.
Figure 22:
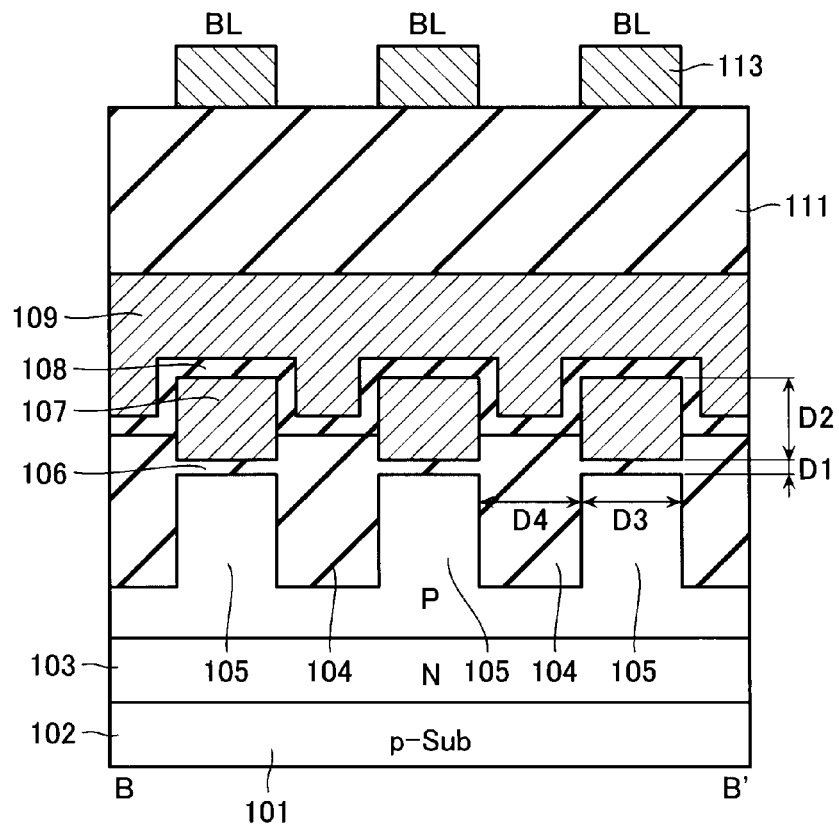
FIG. 22 shows B-B' sectional view of FIG. 20.

FIG. 20 shows a layout of the memory cell array 1; and FIGS. 21 and 22 are A-A' and B-B' sectional views thereof, respectively.

Formed on the cell array area of a p-type silicon substrate 101 is a p-type well 103, which is isolated from others by n-type well 102. Device isolating dielectric film 104 is buried in the p-type well 103 by an STI (Shallow Trench Isolation) method, so that stripe-shaped device forming areas 105 are formed.

Floating gates 107 are formed with a first poly-silicon film on the device forming areas 105 with tunnel isolating film 106 interposed therebetween, and control gates (word lines) 109 are formed on the floating gates 107 with inter-gate dielectric film 108 interposed therebetween.

The fabrication process will be explained in detail as follows. In a state where the first poly-silicon film is formed, form the device isolating groove by etching, and bury the insulating film 104. Simultaneously with this device isolating process, the floating gates 107 of the first poly-silicon film are separated from each other in the word line direction. Further, when etching the second poly-silicon film to form the word line (WL) 109, the floating gates 107 are separated from each other in the bit line direction (the sectional view of FIG. 21).

Select gate lines SGD and SGS are formed with the same poly-silicon films as the floating gates and control gates. Note here that the two poly-silicon films are contacted with each other, and patterned to stacked gate lines.

After patterning the word lines and select gate lines, perform ion implantation, and source/drain diffusion layers 110 and other diffusion layers 110d, 110s, which are used as bit line and source line contact areas, are formed.

The cell array area is covered with interlayer dielectric film 111, on which bit lines (BL) 113 are formed. Bit lines 113 are contacted with the bit line contact-use diffusion layers 110d via contact holes formed in the dielectric film 113. Source line (CELSRC) 112 is also buried in the dielectric film 111 to be contacted with the source line contact-use diffusion layers 110s.

As described above, multiple floating gate type memory cells, i.e., electrically rewritable and non-volatile memory cells, are connected in series to constitute a NAND string, and multiple NAND cell units are arranged in a matrix manner. With respect to the word line direction, multiple memory cells are arranged in such a manner as to be separated from each other with the STI device isolating film 104.

Cell sizes of the main portions in the current cell in the section of FIG. 22 are as follows: the thickness D1 of tunnel insulating film 106 is D1=8.2 nm; total thickness D2 of floating gate 107 is D2=80 nm; width D3 of devise forming area 105 (i.e., AA width) is D3=50 nm; and width D4 of device isolating dielectric film 104 (i.e., STI width) is D4=50 nm.

The cell structure being miniaturized as described above, the parasitic gate effect explained with reference to FIG. 4 may not be ignored in the conventional program method. To remove the influence and secure the data reliability, it is in need of using the program methods explained in Embodiments 1-4.

The present invention will be specifically effective in such a case where STI width D4 is in the range of D4=50 nm~20 nm. The uppermost value is such a level that the parasitic gate effect between adjacent cells in the word line direction becomes remarkable in such a degree that data is erroneously read. The lowest value is such a limit level that the desirable program/read properties are not assured in case the current cell structure is shrunk proportionally. Assuming that AA width is shrunk together with STI width in accordance with the development of the fabrication process technology, the AA width corresponding to the above-described STI width is in the range of D3=50 nm~20 nm.

[Application Devices]

As an embodiment, an electric card using the non-volatile semiconductor memory devices according to the above-described embodiments of the present invention and an electric device using the card will be described bellow.

Figure 23:
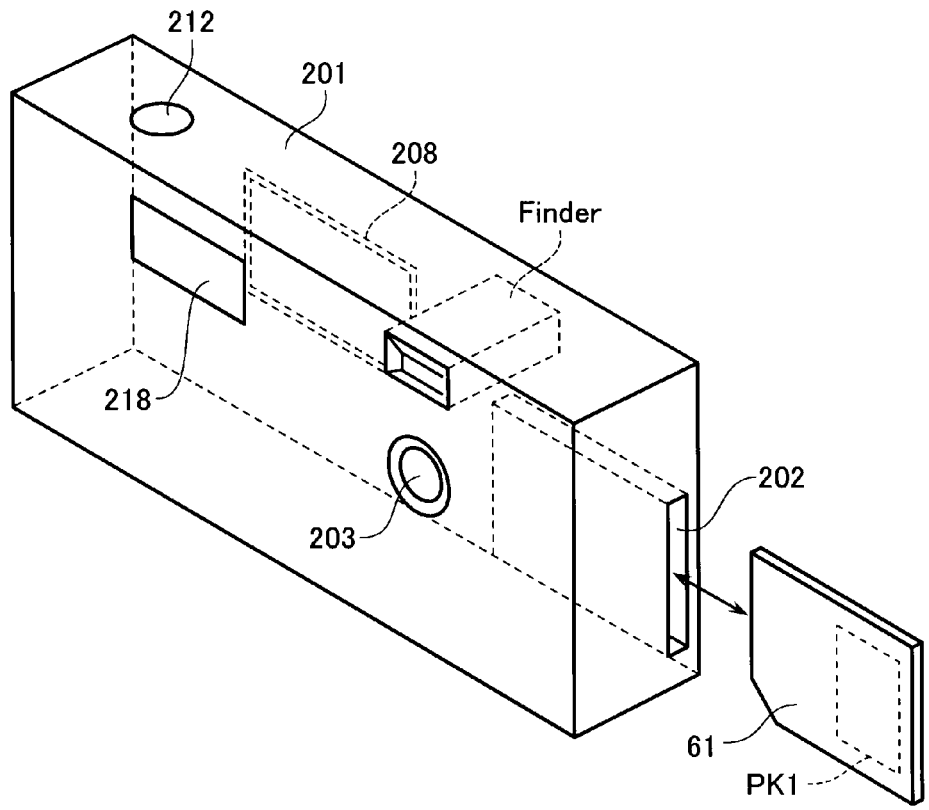
FIG. 23 shows another embodiment applied to a digital still camera.

FIG. 23 shows an electric card according to this embodiment and an arrangement of an electric device using this card. This electric device is a digital still camera 201 as an example of portable electric devices. The electric card is a memory card 61 used as a recording medium of the digital still camera 201. The memory card 61 incorporates an IC package PK1 in which the non-volatile semiconductor memory device or the memory system according to the above-described embodiments is integrated or encapsulated.

The case of the digital still camera 201 accommodates a card slot 202 and a circuit board (not shown) connected to this card slot 202. The memory card 61 is detachably inserted in the card slot 202 of the digital still camera 201. When inserted in the slot 202, the memory card 61 is electrically connected to electric circuits of the circuit board.

If this electric card is a non-contact type IC card, it is electrically connected to the electric circuits on the circuit board by radio signals when inserted in or approached to the card slot 202.

Figure 24:
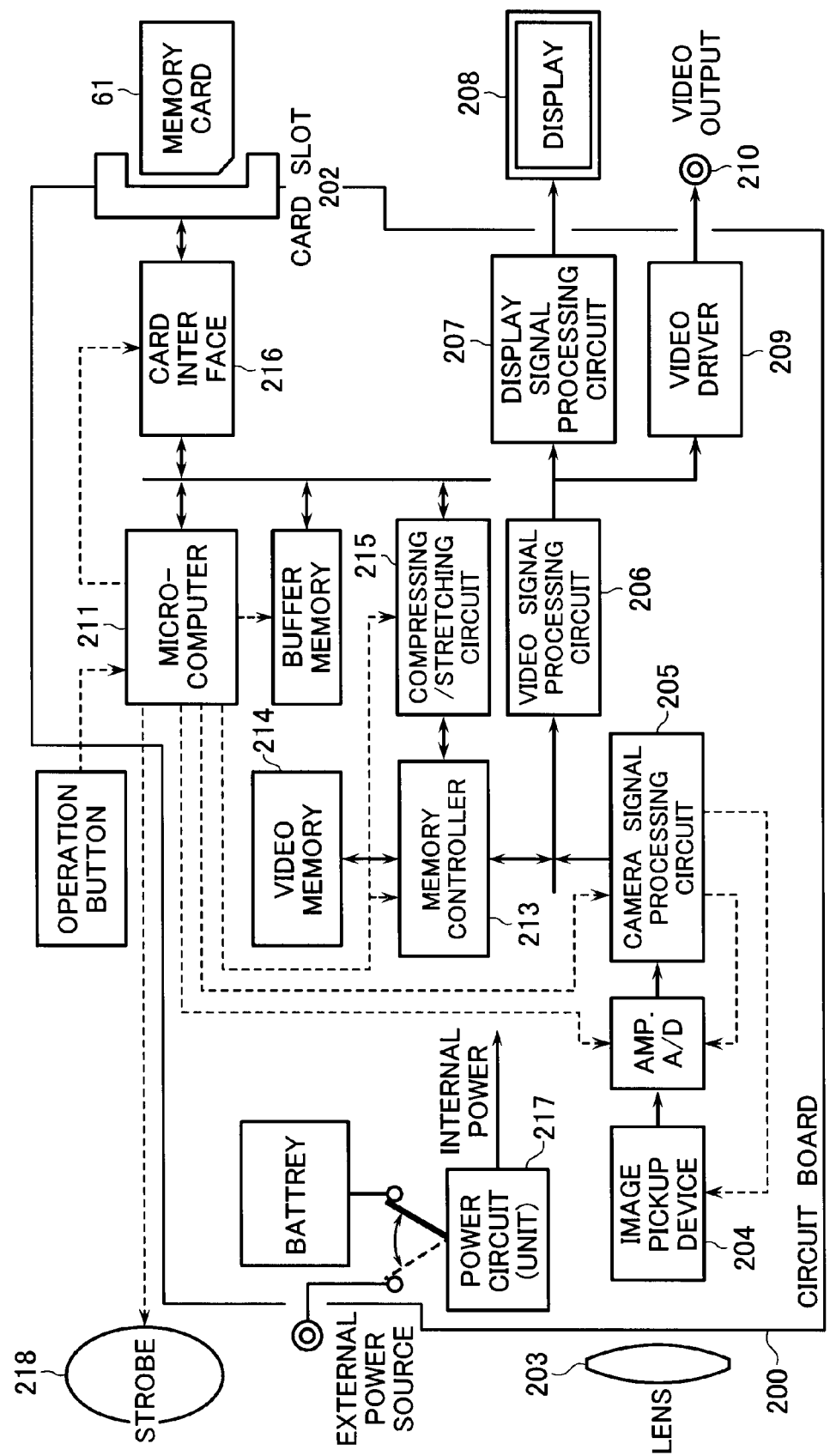
FIG. 24 shows the internal configuration of the digital still camera.
Figure 25A:
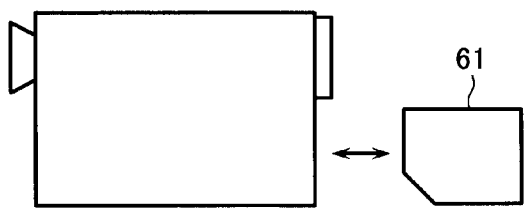
FIGS. 25A to 25J show other electric devices to which the embodiment is applied.
Figure 25F:
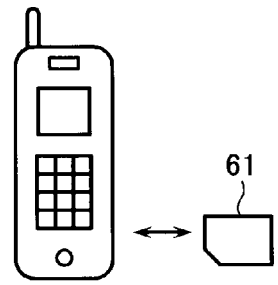
Figure 25B:
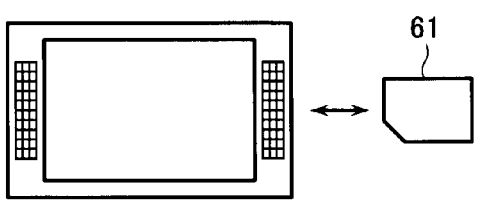
Figure 25G:
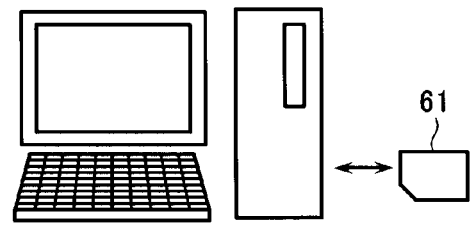
Figure 25C:
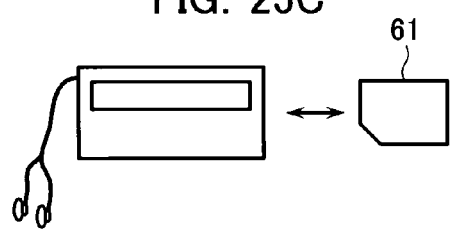
Figure 25H:
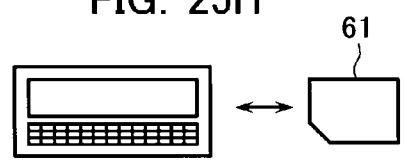
Figure 25D:
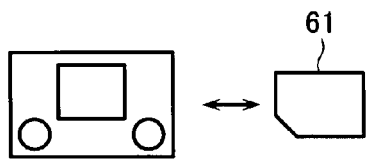
Figure 25I:
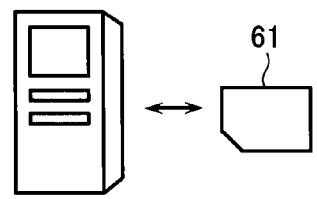
Figure 25E:
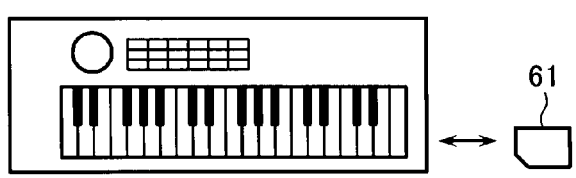
Figure 25J:
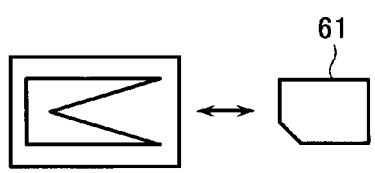

FIG. 24 shows a basic arrangement of the digital still camera. Light from an object is converged by a lens 203 and input to an image pickup device 204. The image pickup device 204 is, for example, a CMOS sensor and photoelectrically converts the input light to output, for example, an analog signal. This analog signal is amplified by an analog amplifier (AMP), and converted into a digital signal by an A/D converter (A/D). The converted signal is input to a camera signal processing circuit 105 where the signal is subjected to automatic exposure control (AE), automatic white balance control (AWB), color separation, and the like, and converted into a luminance signal and color difference signals.

To monitor the image, the output signal from the camera processing circuit 205 is input to a video signal processing circuit 206 and converted into a video signal. The system of the video signal is, e.g., NTSC (National Television System Committee). The video signal is input to a display 208 attached to the digital still camera 201 via a display signal processing circuit 207. The display 208 is, e.g., a liquid crystal monitor.

The video signal is supplied to a video output terminal 210 via a video driver 209. An image picked up by the digital still camera 201 can be output to an image apparatus such as a television set via the video output terminal 210. This allows the pickup image to be displayed on an image apparatus other than the display 208. A microcomputer 211 controls the image pickup device 204, analog amplifier (AMP), A/D converter (A/D), and camera signal processing circuit 205.

To capture an image, an operator presses an operation button such as a shutter button 212. In response to this, the microcomputer 211 controls a memory controller 213 to write the output signal from the camera signal processing circuit 205 into a video memory 214 as a flame image. The flame image written in the video memory 214 is compressed on the basis of a predetermined compression format by a compressing/stretching circuit 215. The compressed image is recorded, via a card interface 216, on the memory card 61 inserted in the card slot.

To reproduce a recorded image, an image recorded on the memory card 61 is read out via the card interface 216, stretched by the compressing/stretching circuit 215, and written into the video memory 214. The written image is input to the video signal processing circuit 206 and displayed on the display 208 or another image apparatus in the same manner as when image is monitored.

In this arrangement, mounted on the circuit board 200 are the card slot 202, image pickup device 204, analog amplifier (AMP), A/D converter (A/D), camera signal processing circuit 205, video signal processing circuit 206, display signal processing circuit 207, video driver 209, microcomputer 211, memory controller 213, video memory 214, compressing/stretching circuit 215, and card interface 216.

The card slot 202 need not be mounted on the circuit board 200, and can also be connected to the circuit board 200 by a connector cable or the like.

A power circuit 217 is also mounted on the circuit board 200. The power circuit 217 receives power from an external power source or battery and generates an internal power source voltage used inside the digital still camera 201. For example, a DC-DC converter can be used as the power circuit 217. The internal power source voltage is supplied to the respective circuits described above, and to a strobe 218 and the display 208.

As described above, the electric card according to this embodiment can be used in portable electric devices such as the digital still camera explained above. However, the electric card can also be used in various apparatus such as shown in FIGS. 25A to 25J, as well as in portable electric devices. That is, the electric card can also be used in a video camera shown in FIG. 25A, a television set shown in FIG. 25B, an audio apparatus shown in FIG. 25C, a game apparatus shown in FIG. 25D, an electric musical instrument shown in FIG. 25E, a cell phone shown in FIG. 25F, a personal computer shown in FIG. 25G, a personal digital assistant (PDA) shown in FIG. 25H, a voice recorder shown in FIG. 25I, and a PC card shown in FIG. 25J.

This invention is not limited to the above-described embodiment. It will be understood by those skilled in the art that various changes in form and detail may be made without departing from the spirit, scope, and teaching of the invention.

What is claimed is:

1. A method for programming a semiconductor memory device comprising such a program sequence as to program target threshold levels constituting multi-level data into multiple memory cells, which are simultaneously selected, wherein the program sequence is controlled to finish programming the multiple memory cells in order of height of the target threshold levels; wherein the program sequence is to program target threshold levels C, B and A (where C>B>A) from a certain threshold level into the multiple memory cells, and wherein step-up voltages $\Delta VPGMC$, $\Delta VPGMB$ and $\Delta VPGMA$ of the program voltages of the target threshold levels C, B and A, respectively, are set to satisfy the following relationship of:

$$\Delta VPGMB < \Delta VPGMA < \Delta VPGMC.$$

2. The method according to claim 1, wherein the program sequence is executed with program cycles repeated in such a way that a program voltage is stepped-up every program cycle, the program cycle including: applying the program voltage to the multiple memory cells; and program-verifying them, and wherein while certain memory cells to be programmed to a certain target threshold level are programmed, the remaining memory cells to be programmed to other target threshold levels are set in a program-inhibiting state, and initial program voltages and step-up voltages thereof used for programming the respective target threshold levels are set to be suitable in accordance with the target threshold levels.

3. The method according to claim 2, wherein the initial program voltage is obtained by amending another initial program voltage used in an advanced program operation with reference to the number of program cycles in the advanced program operation.

4. The method according to claim 2, wherein the program sequence comprises:

performing program speed judgment for memory cells to be programmed to a certain target threshold level at the beginning of the program cycles, thereby distinguishing between slow cells and fast cells, the former being lower in program speed than the latter; and continuing the remaining program cycles in such a manner as to program the slow cells and fast cells with different program voltages applied, and verify-read them simultaneously.

5. The method according to claim 4, wherein the scheme for programming the slow cells and fast cells with different program voltages applied is adapted to at least the uppermost one within the threshold levels to be programmed.

6. The method according to claim 4, wherein the program speed judgment is performed as a verify-read operation with a verify voltage set at substantially the central value of an obtained threshold distribution.

7. The method according to claim 4, wherein the program sequence is an upper page program sequence for programming four-level data after finishing a lower page program sequence, and wherein the number of program cycles required for setting the initial program voltage used in the upper page program sequence is obtained in the lower page program sequence.

8. The method according to claim 4, wherein the program sequence is for straightly programming data levels A, B and C from an erase data level E in order from the highest level C (where, E<A<B<C), and wherein the number of program cycles required for setting the initial program voltage is obtained in a dummy lower page program mode.

9. The method according to claim 4, wherein the program sequence is for straightly programming data levels A, B and C from an erase data level E in order from the highest level C (where, E<A<B<C), and wherein the number of program cycles required for setting the initial program voltage is obtained in a wafer test mode.

10. The method according to claim 4, wherein with respect to programming the slow cells and fast cells on a selected word line, the slow cells are programmed with a certain program voltage ahead of the fast cells, and the program voltage is stepped-down and applied to the fast cells.

11. The method according to claim 1, wherein the semiconductor memory device includes a memory cell array, in which NAND strings are arranged, the NAND string having a plurality of electrically rewritable and non-volatile memory cells connected in series.

12. A method for programming a semiconductor memory device comprising such a program sequence as to program target threshold levels constituting multi-level data into multiple memory cells, which are simultaneously selected, wherein the program sequence comprises: distinguishing between slow cells and fast cells with respect to memory cells to be programmed to a certain target threshold, the former being lower in program speed than the latter;

applying a program voltage pulse to the multiple memory cells, in which the program voltage is changed in level in correspondence with not only different target threshold levels to be programmed but also the slow cells and fast cells to be programmed to the certain target threshold level; and verify-reading the memory cells after applying the program voltage pulse; wherein the program sequence is to program target threshold levels C, B and A (where C>B>A) from a certain threshold level into the multiple memory cells, and wherein step-up voltages $\Delta VPGMC$, $\Delta VPGMB$ and $\Delta VPGMA$ of the program voltages of the target threshold levels C, B and A, respectively, are set to satisfy the following relationship of:

$$\Delta VPGMB < \Delta VPGMA < \Delta VPGMC.$$

13. The method according to claim 12, wherein
in the program sequence, until when all memory cells to be programmed to a first threshold level reaches a second threshold level lower than the first threshold level, memory cells to be programmed to the second threshold level are kept in a program-inhibiting state.

14. The method according to claim 12, wherein
the program voltage pulse application and verify-reading operation are repeatedly performed in the program sequence by stepping-up the program voltage pulse by a constant level every program cycle.

15. The method according to claim 12, wherein
the semiconductor memory device includes a memory cell array, in which NAND strings are arranged, the NAND string having a plurality of electrically rewritable and non-volatile memory cells connected in series.

16. A method for programming a semiconductor memory device comprising such a program sequence as to program target threshold levels constituting multi-level data into multiple memory cells, which are simultaneously selected, wherein
the program sequence is controlled to finish programming the multiple memory cells in order of height of the target threshold levels, wherein
the program sequence is executed with program cycles repeated in such a way that a program voltage is stepped-up every program cycle, the program cycle including:
applying the program voltage to the multiple memory cells; and program-verifying them, and wherein
while certain memory cells to be programmed to a certain target threshold level are programmed, the remaining memory cells to be programmed to other target threshold levels are set in a program-inhibiting state, and
initial program voltages and step-up voltages thereof used for programming the respective target threshold levels are set to be suitable in accordance with the target threshold levels, wherein
the program sequence comprises:
performing program speed judgment for memory cells to be programmed to a certain target threshold level at the beginning of the program cycles, thereby distinguishing between slow cells and fast cells, the former being lower in program speed than the latter; and
continuing the remaining program cycles in such a manner as to program the slow cells and fast cells with different program voltages applied, and verify-read them simultaneously, wherein
the program sequence is for straightly programming data levels A, B and C from an erase data level E in order from the highest level C (where, E<A<B<C), and wherein the number of program cycles required for setting the initial program voltage is obtained in the program cycle of data level C.

* * * * *